United States Patent
Nobert et al.

(10) Patent No.: US 12,442,701 B2
(45) Date of Patent: Oct. 14, 2025

(54) STRUCTURAL LOCATING SENSORS FOR A SENSOR MODULE USING A PRINTED CIRCUIT BOARD ASSEMBLY

(71) Applicant: BRP Megatech Industries Inc., Valcourt (CA)

(72) Inventors: Jonathan Nobert, Trois-Rivières (CA); Francis Gagné, Saint-Roch-de-Mékinac (CA)

(73) Assignee: BRP Megatech Industries Inc., Valcourt (CA)

( * ) Notice: Subject to any disclaimer, the term of this patent is extended or adjusted under 35 U.S.C. 154(b) by 490 days.

(21) Appl. No.: 17/904,840

(22) PCT Filed: Mar. 4, 2020

(86) PCT No.: PCT/IB2020/051892
§ 371 (c)(1),
(2) Date: Aug. 23, 2022

(87) PCT Pub. No.: WO2021/176251
PCT Pub. Date: Sep. 10, 2021

(65) Prior Publication Data
US 2023/0105697 A1 Apr. 6, 2023

(51) Int. Cl.
*G01L 3/10* (2006.01)
*H05K 1/14* (2006.01)
(Continued)

(52) U.S. Cl.
CPC .............. *G01L 3/101* (2013.01); *H05K 3/365* (2013.01); *H05K 3/366* (2013.01); *G01L 5/221* (2013.01);
(Continued)

(58) Field of Classification Search
CPC ............. G01L 1/00–26; G01L 3/00–26; G01L 5/00–288; H05K 2201/10151
See application file for complete search history.

(56) References Cited

U.S. PATENT DOCUMENTS

RE30,168 E * 12/1979 Mason ................... B65D 59/02
242/613.5
5,008,496 A 4/1991 Schmidt et al.
(Continued)

FOREIGN PATENT DOCUMENTS

EP 3457103 A1 3/2019
KR 101002275 B1 12/2010
(Continued)

OTHER PUBLICATIONS

Adafruit, "Game of Life Webpage", https://learn.adafruit.com/game-of-life/, 2013-2022, 9 pages.
(Continued)

*Primary Examiner* — Judy Nguyen
*Assistant Examiner* — James Split
(74) *Attorney, Agent, or Firm* — BCF LLP

(57) ABSTRACT

A sensor assembly for a vehicle including a sensor module having a main printed circuit board (PCB). A plurality of auxiliary printed circuit boards (PCBs) are coupled to the main PCB and electrically connected to the main PCB. Each of the plurality of auxiliary PCBs has at least one sensor that is configured to generate a signal. Each of the plurality of auxiliary PCBs are coupled to each other in a defined position relative to each other. A plurality of attachment elements couple the plurality of auxiliary PCBs and the main PCB to at least partially maintain the defined positions of the auxiliary PCBs relative to each other and to electrically connect the plurality of auxiliary PCBs to the main PCB. A retainer abuts the plurality of auxiliary PCBs.

22 Claims, 28 Drawing Sheets

(51) Int. Cl.
*H05K 3/36* (2006.01)
*G01L 5/22* (2006.01)

(52) U.S. Cl.
CPC ......... *H05K 1/141* (2013.01); *H05K 2201/04* (2013.01); *H05K 2201/047* (2013.01); *H05K 2201/09063* (2013.01); *H05K 2201/09827* (2013.01); *H05K 2201/10151* (2013.01); *H05K 2201/10295* (2013.01); *H05K 2201/10303* (2013.01)

(56) References Cited

U.S. PATENT DOCUMENTS

| | | | |
|---|---|---|---|
| 5,071,223 A | 12/1991 | Gotoh et al. | |
| 6,137,691 A | 10/2000 | Jang | |
| 6,215,671 B1 | 4/2001 | Kalis | |
| 6,847,521 B2 | 1/2005 | Beall et al. | |
| 6,890,184 B2 | 5/2005 | Doblar et al. | |
| 7,008,236 B2 | 3/2006 | Wabiszczewicz | |
| 7,562,591 B2 | 7/2009 | Lee | |
| 8,025,515 B2 | 9/2011 | Diaz | |
| 8,406,009 B2 * | 3/2013 | Lev | H05K 1/0271 174/268 |
| 8,971,048 B2 | 3/2015 | Lucas et al. | |
| 8,988,066 B2 | 3/2015 | Shao et al. | |
| 9,107,304 B2 | 8/2015 | Wang et al. | |
| 9,288,907 B2 | 3/2016 | Hu et al. | |
| 9,744,472 B2 | 8/2017 | DiCiacce | |
| 9,999,123 B2 | 6/2018 | Kishi et al. | |
| 10,057,987 B2 | 8/2018 | Wang et al. | |
| 10,070,517 B2 | 9/2018 | Kawai | |
| 10,264,674 B2 | 4/2019 | Yonemori et al. | |
| 10,404,015 B2 | 9/2019 | Francisco et al. | |
| 10,410,989 B2 | 9/2019 | Hall et al. | |
| 11,422,048 B2 * | 8/2022 | Schanz | G01L 5/0019 |
| 12,111,220 B2 * | 10/2024 | Hintze | G01L 3/104 |
| 2009/0040736 A1 | 2/2009 | Becherer et al. | |
| 2009/0175019 A1 * | 7/2009 | Koyama | H05K 3/323 257/E21.705 |
| 2011/0210493 A1 | 9/2011 | Murai | |
| 2013/0335072 A1 | 12/2013 | Malzfeldt | |
| 2016/0360621 A1 | 12/2016 | Shimamiya et al. | |
| 2017/0048998 A1 | 2/2017 | Lee | |
| 2018/0324950 A1 | 11/2018 | Nomura | |
| 2019/0023305 A1 | 1/2019 | Fujimoto | |
| 2019/0025143 A1 | 1/2019 | Doll | |
| 2019/0037689 A1 | 1/2019 | Du et al. | |
| 2019/0233291 A1 | 8/2019 | Achee et al. | |

FOREIGN PATENT DOCUMENTS

| | | |
|---|---|---|
| WO | 2017212964 A1 | 12/2017 |
| WO | 2018096927 A1 | 5/2018 |
| WO | 2019068826 A1 | 4/2019 |

OTHER PUBLICATIONS

Geek Times, "Full Cube Assembled Picture/Webpage", http://edge.rit.edu/edge/P07897/public/FullCubeAssembled.jpg, 2019, 1 page.
GPLExtek, "The GPLExtek Hypercube Webpage", http://www.gplextek.com/documentation.html, 2017, 7 pages.
International Search Report for Application No. PCT/IB2020/051892 dated Dec. 22, 2020, 4 pages.
Sipos, Brian, "Cube Frame Thesis Progress", P07897, http://edge.rit.edu/content/P07897/public/Progress, 2007, 3 pages.
Wurth Elektronik, Flex-Rigid Design Guide, Mar. 2018, 8 pages.
English language abstract for KR 101002275 B1 extracted from espacenet.com database on Aug. 24, 2022, 1 page.
Communication pursuant to Rule 71(3) EPC (namely Intent to Grant) issued during the prosecution of corresponding application No. 20712044.5, dated Aug. 4, 2025.

* cited by examiner

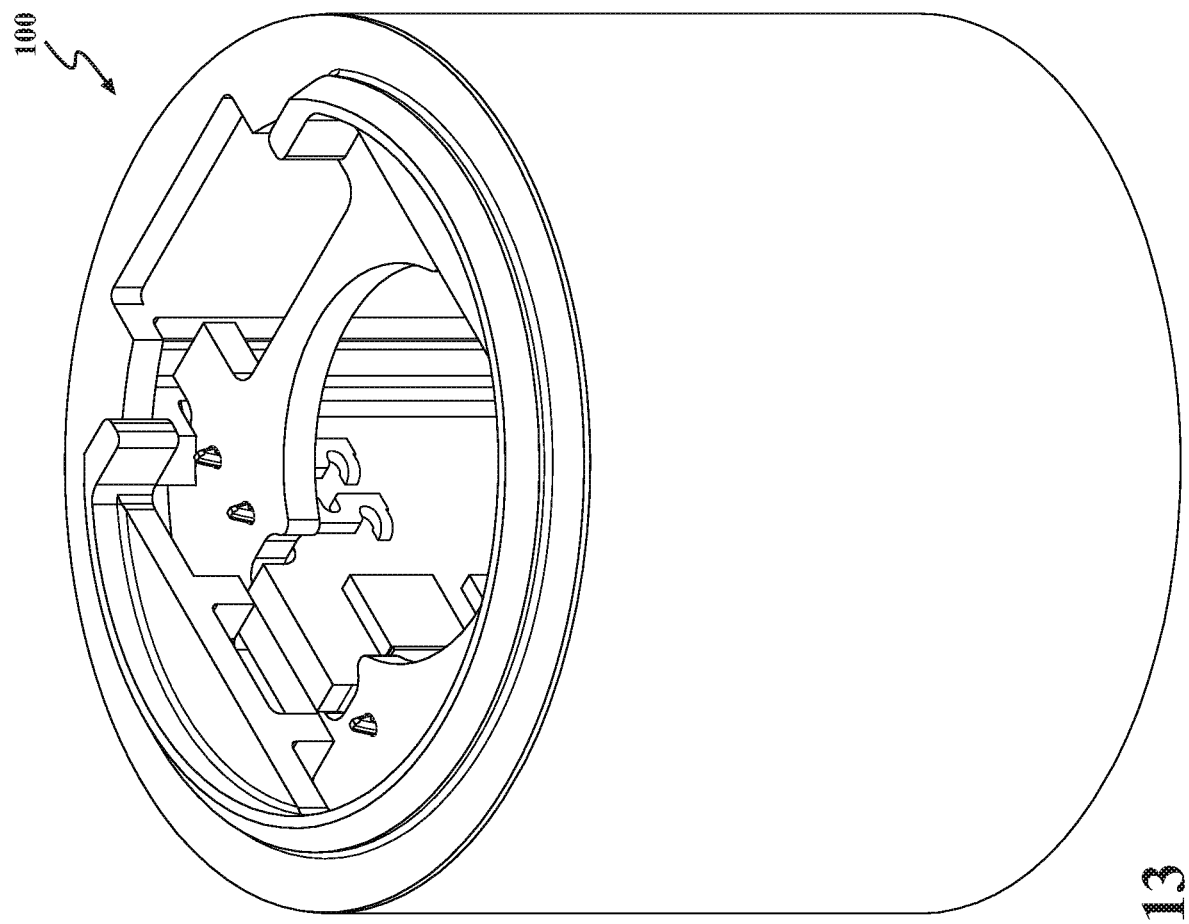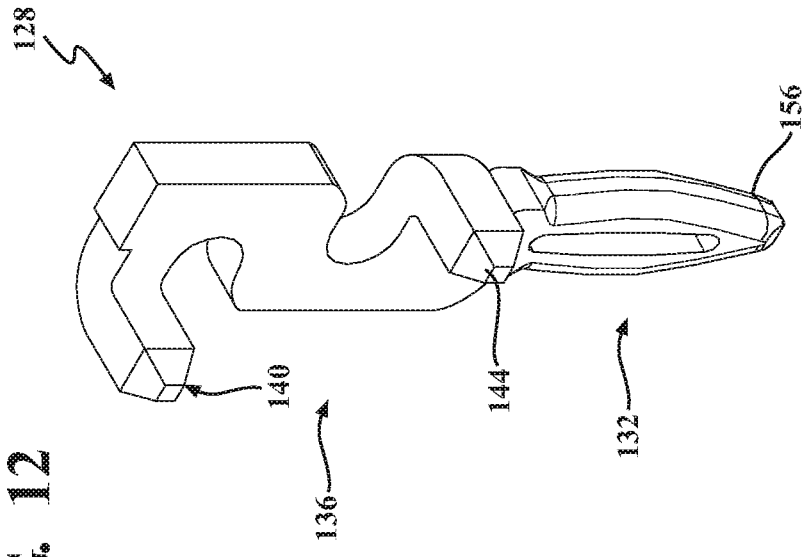

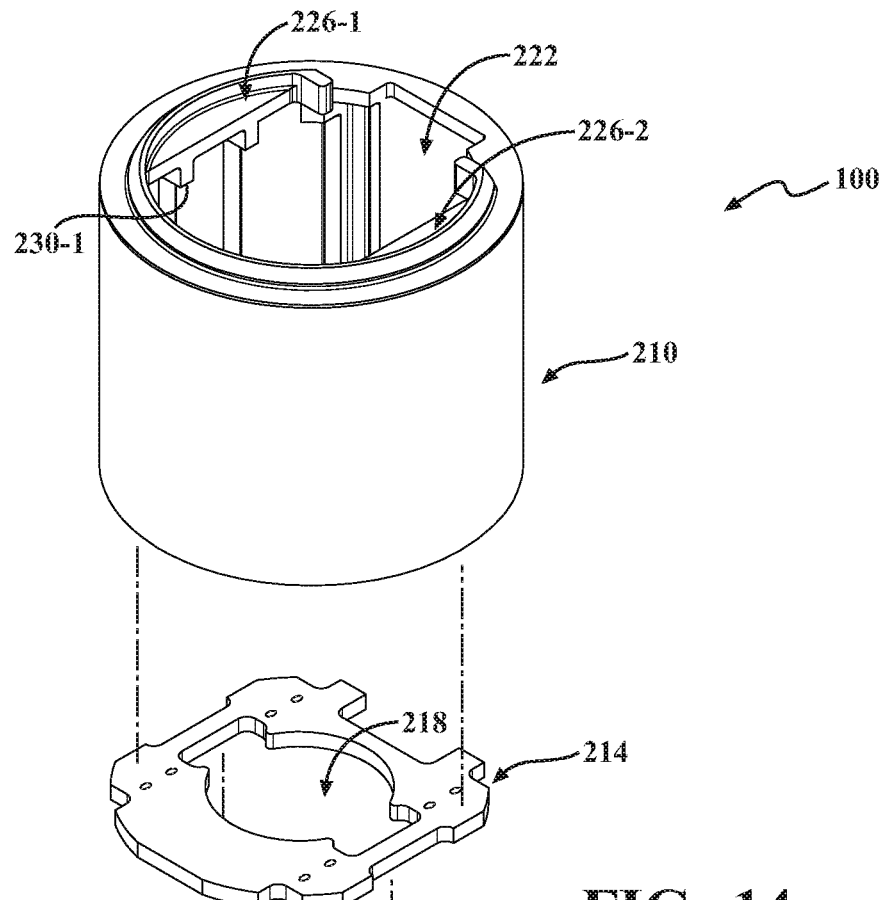
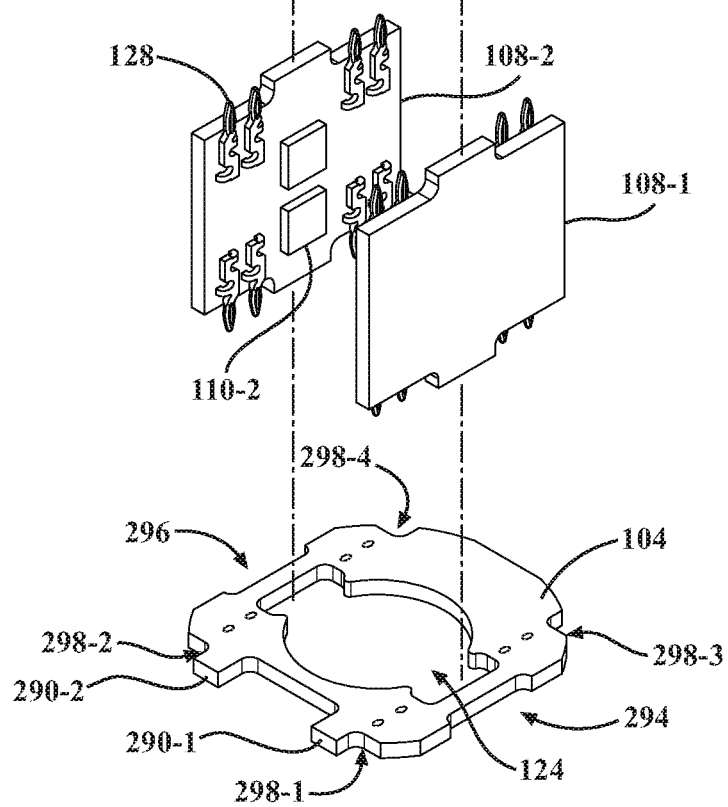
FIG. 14

STRUCTURAL LOCATING SENSORS FOR A SENSOR MODULE USING A PRINTED CIRCUIT BOARD ASSEMBLY

CROSS REFERENCE TO RELATED APPLICATIONS

This application is the National Stage of International Patent Application No. PCT/IB2020/051892, filed on Mar. 4, 2020, the contents of which are incorporated herein by reference.

TECHNICAL FIELD

The present disclosure relates generally to systems and methods of structural locating sensors for a sensor module using a printed circuit board assembly (PCBA).

BACKGROUND

A magnetoelastic torque sensor assembly measures applied torque. The magnetoelastic torque sensor assembly comprises a shaft which receives the applied torque. The shaft comprises magnetoelastic regions, the magnetic characteristics of which change in response to the applied torque. A plurality of sensors are disposed adjacent to the shaft, near the magnetoelastic regions, and measure the magnetic fields generated by the magnetoelastic regions. In this way, the torque sensor assembly is able to detect changes in applied torque via the measured magnetic fields.

SUMMARY

In a feature, a sensor assembly for a vehicle is provided. The sensor assembly includes a sensor module having a main printed circuit board (PCB), a plurality of auxiliary printed circuit boards (PCBs), a plurality of attachment elements, and a retainer. The plurality of auxiliary printed circuit boards (PCBs) is coupled to the main PCB. Each of the plurality of auxiliary PCBs has at least one sensor that is configured to generate a signal. Each of the plurality of auxiliary PCBs are coupled to the main PCB and to each other in a defined position relative to each other. The plurality of attachment elements couple said plurality of auxiliary PCBs to said main PCB to at least partially maintain said defined position of each of said auxiliary PCBs relative to each other and to electrically connect the auxiliary PCBs to the main PCB. The retainer abuts the auxiliary PCBs. The sensor assembly also includes a component that is positioned adjacent the sensor module and moveable relative to the sensor module with the component having an emitter. The signal generated by the at least one sensor of each auxiliary PCB is based on movement of the component and the emitter. The sensor assembly also includes a controller operatively connected to the at least one sensor of each of the plurality of auxiliary PCBs and configured to determine a magnitude of movement based on the signal from the at least one sensor of each of the plurality of auxiliary PCBs.

In further features, the plurality of attachment elements are configured to electrically connect said auxiliary PCBs to said main PCB.

In further features, the said plurality of attachment elements is configured to electrically connect a plurality of terminals of said plurality of auxiliary PCBs to a plurality of terminals of said main PCB.

In further features, the retainer includes a plurality of retention members that directly engage the plurality of auxiliary PCBs.

In further features, the plurality of retention members includes at least four retention members.

In further features, the plurality of retention members includes at least eight retention members.

In further features, the plurality of retention members are perpendicular to the plurality of auxiliary PCBs.

In further features, the plurality of auxiliary PCBs are mated together to form a plurality of corners.

In further features, the plurality of auxiliary PCBs are mated together to form a plurality of corners, the plurality of retention members includes a plurality of pairs of retention members and each pair of retention members of the plurality of pairs of retention members engages a corresponding corner of the plurality of corners.

In further features, the plurality of retention members are flexible.

In further features, the plurality of auxiliary PCBs include at least one tab for engaging an adjacent auxiliary PCB.

In further features, the retainer includes a plurality of posts selectively engaging the main PCB in order to provide a stop for the retainer.

In further features, the retainer defines a cavity, at least a portion of each of the plurality of auxiliary PCBs is disposed inside of the cavity and the retainer also includes a flange.

In further features, each of the plurality of auxiliary PCBs includes a first section, a second section, and a third section, with each of the first section and the third section providing support to the corresponding auxiliary PCB.

In further features, at least a portion of the auxiliary PCBs has grooves to interconnect to an adjacent auxiliary PCB of the plurality of auxiliary PCBs.

In further features, at least a portion of the auxiliary PCBs has notches to interconnect to an adjacent auxiliary PCB of the plurality of auxiliary PCBs.

In further features, the retainer includes a top member and an outer member, the top member is configured to be coupled to the plurality of auxiliary PCBs to define the coupling of each of the plurality of auxiliary PCBs to each other, and the outer member, having a cylindrical shape, being configured to be disposed over the top member, the auxiliary PCBs and the main PCB.

In further features, the plurality of auxiliary PCBs includes a first auxiliary PCB and a second auxiliary PCB, a bottom end of the first auxiliary PCB is coupled to the main PCB and a top end of the first auxiliary PCB is coupled to the top member of the retainer, and a bottom end of the second auxiliary PCB is coupled to the main PCB and a top end of the second auxiliary PCB is coupled to the top member of the retainer.

In further features, an inner surface of the outer member has a plurality of ribs configured to engage with the top member and the main PCB.

In further features, the outer member of the retainer includes a first lip and a second lip, an underside of the first lip includes a first plurality of extensions, an underside of the second lip includes a second plurality of extensions, and the first plurality of extensions and the second plurality of extensions are configured to engage with the top member of the retainer.

In further features, a portion of each auxiliary PCB of the plurality of auxiliary PCBs extends outward from the retainer.

In further features, a plurality of sides are coupled between the plurality of auxiliary PCBs.

In further features, the component is a shaft and the sensor module defines a channel to receive the shaft.

In further features, the retainer includes a center aperture defining a first end of the channel and the main PCB includes a center aperture defining a second end of the channel.

In further features, the center aperture of the retainer is axially aligned with the center aperture of the main PCB.

In further features, the emitter is further defined as at least one region being magnetoelastic and configured to generate a magnetic field in response to an applied torque, the signal generated by the at least one sensor of each of the plurality of auxiliary PCBs is indicative of the magnetic field.

In further features, the controller is arranged on the main printed circuit board.

In further features, the plurality of attachment elements are press-fit pins.

In further features, each of said plurality of auxiliary PCBs are directly coupled to each other.

In further features, the retainer abuts the auxiliary PCBs to at least partially maintain the defined position of the PCBs relative to each other.

In further features, the plurality of attachment elements is integrally formed with the plurality of auxiliary PCBs.

BRIEF DESCRIPTION OF THE DRAWINGS

Other advantages of the present disclosure will be readily appreciated, as the same becomes better understood by reference to the following detailed description when considered in connection with the accompanying drawings wherein:

FIG. 12 depicts a perspective view of an attachment element of the torque sensor module of FIG. 3 according to the teachings of the present disclosure.

FIG. 13 depicts a perspective view of a second embodiment of a torque sensor module according to the teachings of the present disclosure.

FIG. 14 depicts a first exploded view of the torque sensor module of FIG. 13 according to the teachings of the present disclosure.

DETAILED DESCRIPTION

Figure 1A:
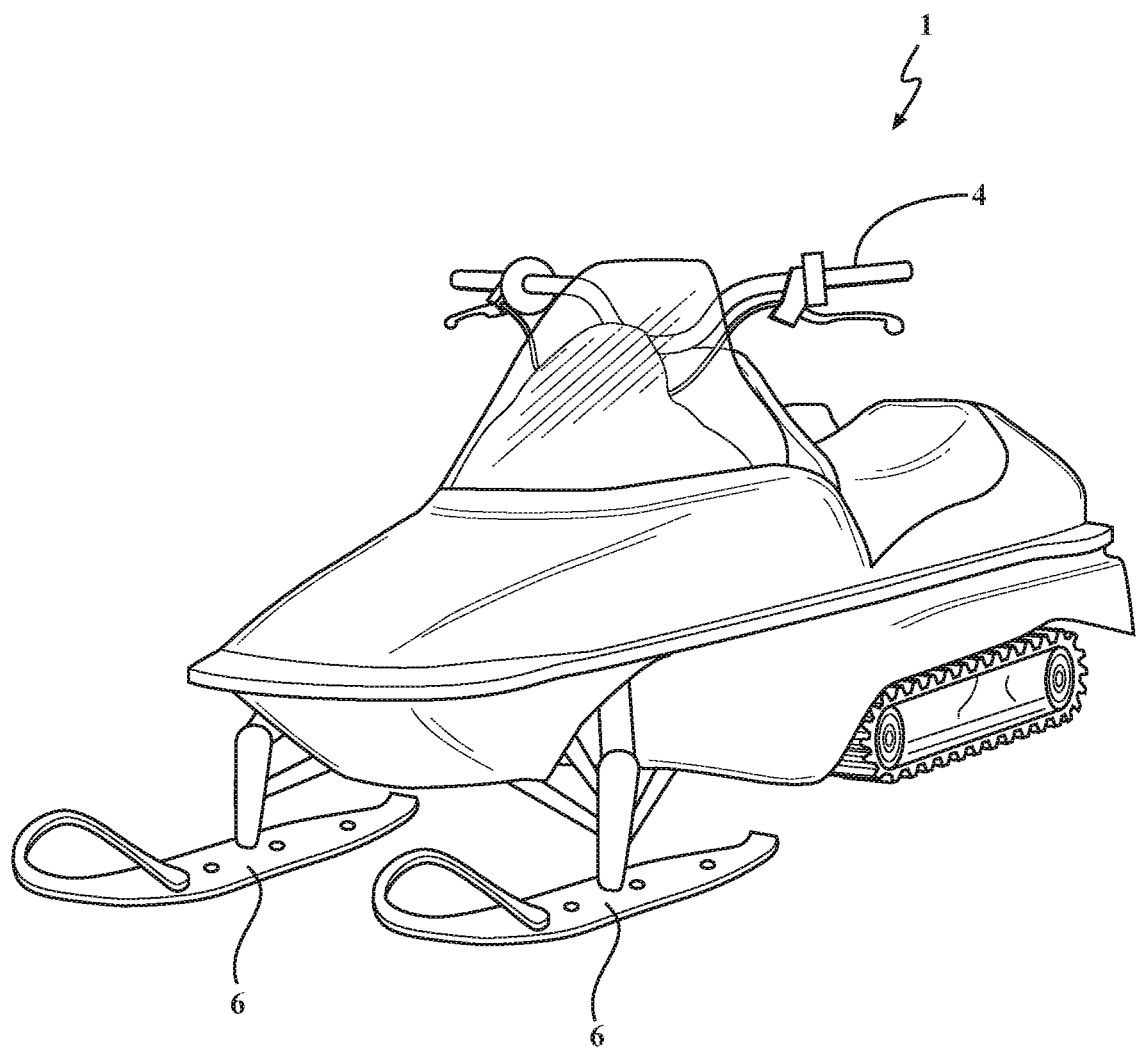
FIGS. 1A and 1B depict perspective views of example vehicles which may incorporate a torque sensor assembly according to the teachings of the present disclosure.
Figure 1B:
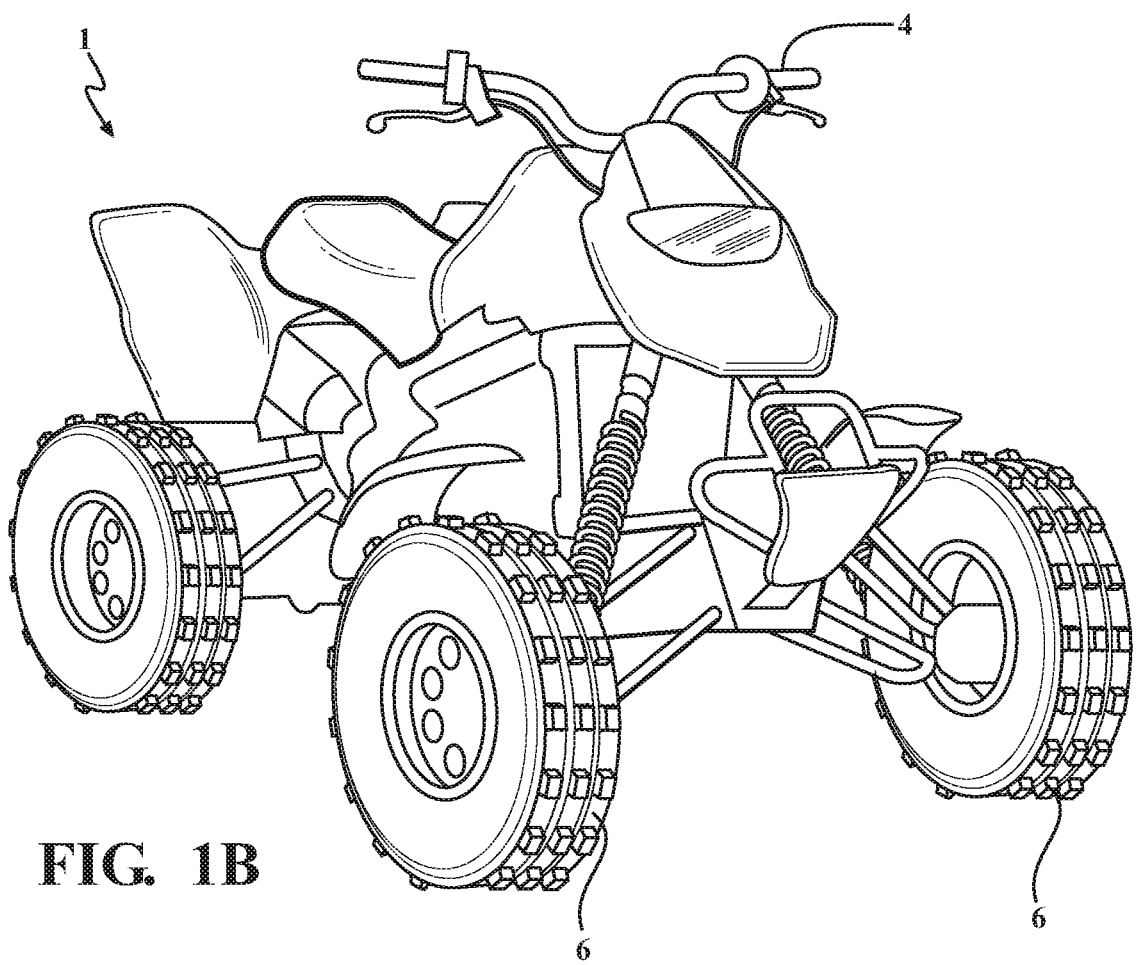

Referring to FIGS. 1A and 1B, the torque sensor assembly 10 may be used in an example vehicle 1. The vehicle 1 may be a snowmobile, an all-terrain vehicle (ATV) such as a four wheeler or a three wheeler, a motorcycle, a standard car, a full size or standard size truck, a semi-truck, etc. While examples of the vehicle 1 are provided, the vehicle 1 is not limited to these examples, the vehicle 1 may be another suitable type of vehicle.

Figure 2:
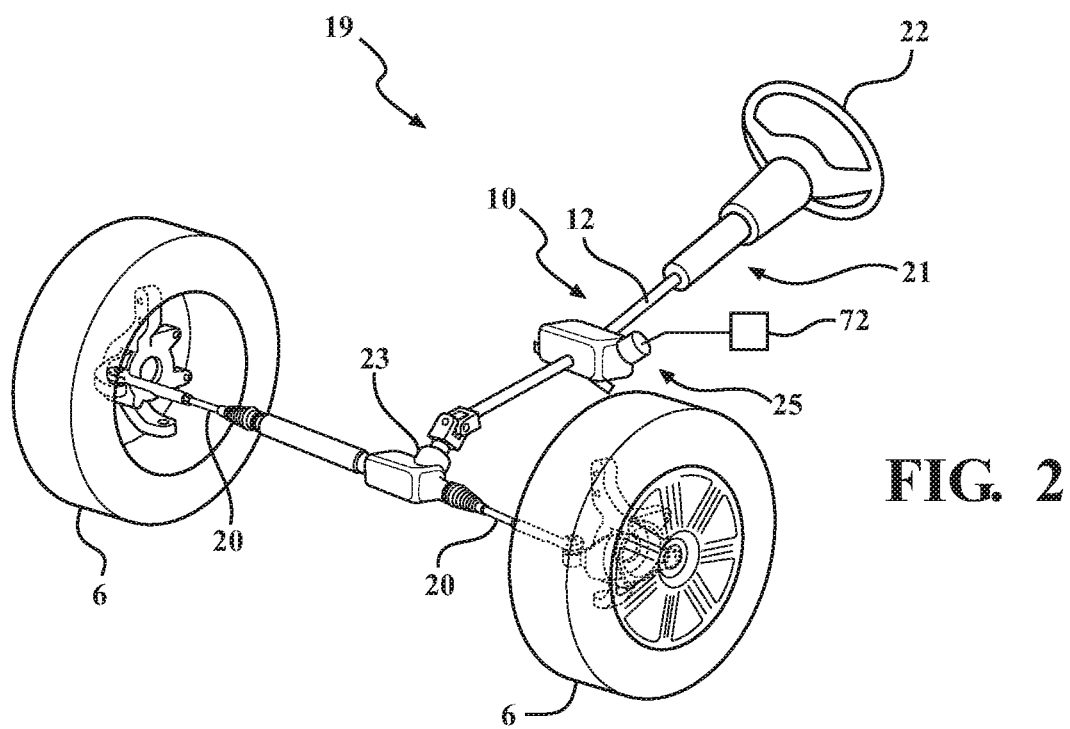
FIG. 2 depicts a perspective view of a power steering system including a torque sensor assembly according to the teachings of the present disclosure.

An example steering assembly 19 of the vehicle 1 is shown in FIG. 2 with a torque sensor assembly 10 of the present disclosure. The torque sensor assembly 10 of the present disclosure provides a low-cost solution to provide precise alignment of electronic components (i.e., sensors) around a component being sensed that has a good response when exposed to vibration. The steering assembly 19 additionally includes a power steering system 25. The power steering system 25 is an electric power steering system. However, it is contemplated that the power steering system 25 may be any power steering system. The power steering system 25 includes a controller 72 which may receive and deliver various inputs and outputs to and from various portions of the vehicle 1. The controller may be configured to communicate with various components in the vehicle 1 using a communication protocol such as a local interconnect network (LIN), a controller area network (CAN), or another suitable communication protocol. Additionally, the controller 72 may be configured to control the torque sensor assembly 10. The controller 72 may perform various control operations in order to determine an amount of applied torque, as described in more detail herewith.

In this application, the term "controller" or the term "module" may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip. The controller 72 may include one or more interface circuits. In some examples, the interface circuit(s) may implement wired or wireless interfaces that connect to a local area network (LAN) or a wireless personal area network (WPAN).

The controller 72 may communicate with other controllers using the interface circuit(s). Although the controller may be depicted in the present disclosure as logically communicating directly with other controllers, in various implementations the controller may actually communicate via a communications system. The communications system includes physical and/or virtual networking equipment such as hubs, switches, routers, and gateways. In some implementations, the communications system connects to or traverses a wide area network (WAN) such as the Internet. For example, the communications system may include multiple LANs connected to each other over the Internet or point-to-point leased lines using technologies including Multiprotocol Label Switching (MPLS) and virtual private networks (VPNs).

Figure 4:
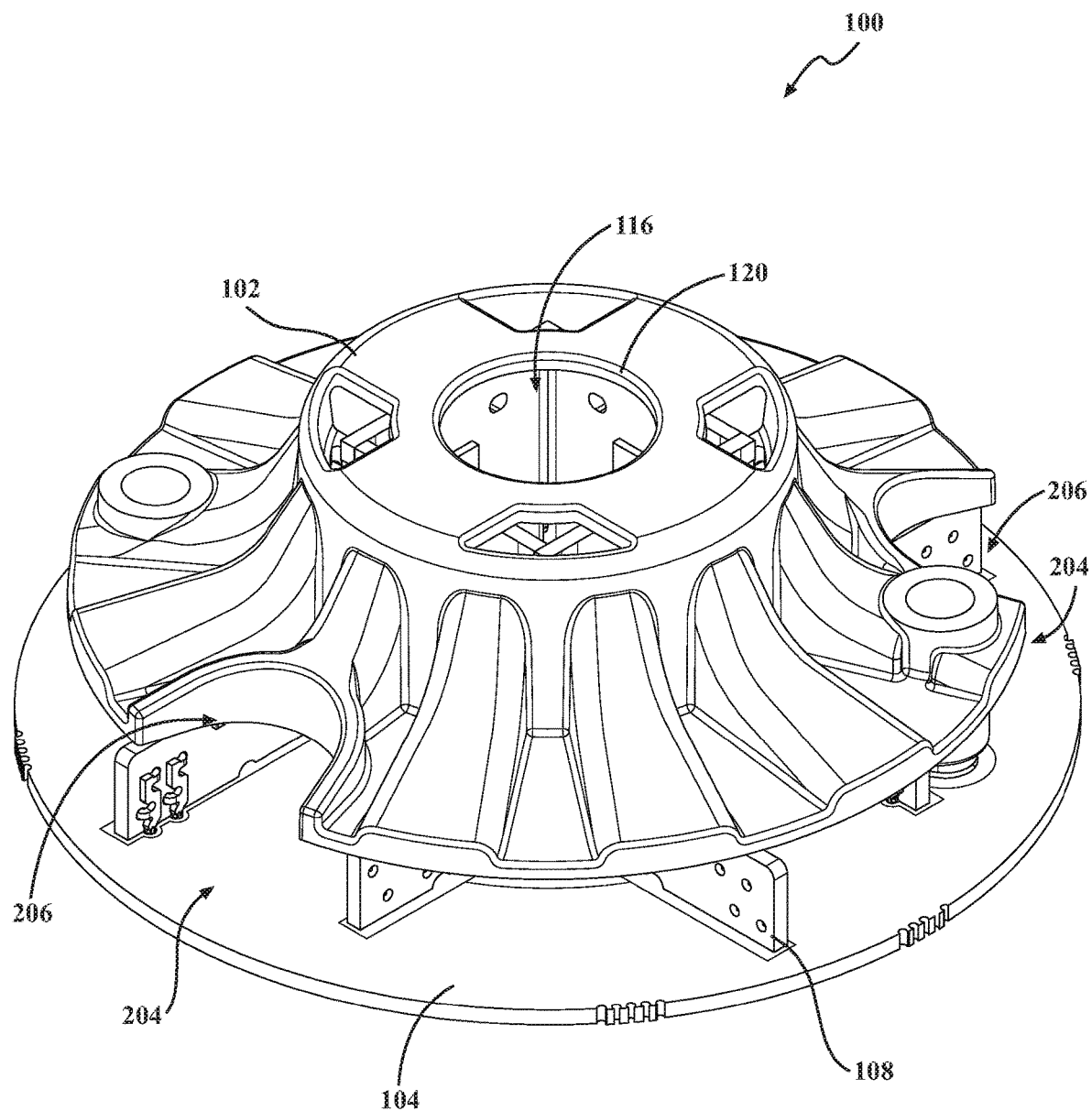
FIG. 4 depicts a perspective view of the torque sensor module of FIG. 3 according to the teachings of the present disclosure.
Figure 5:
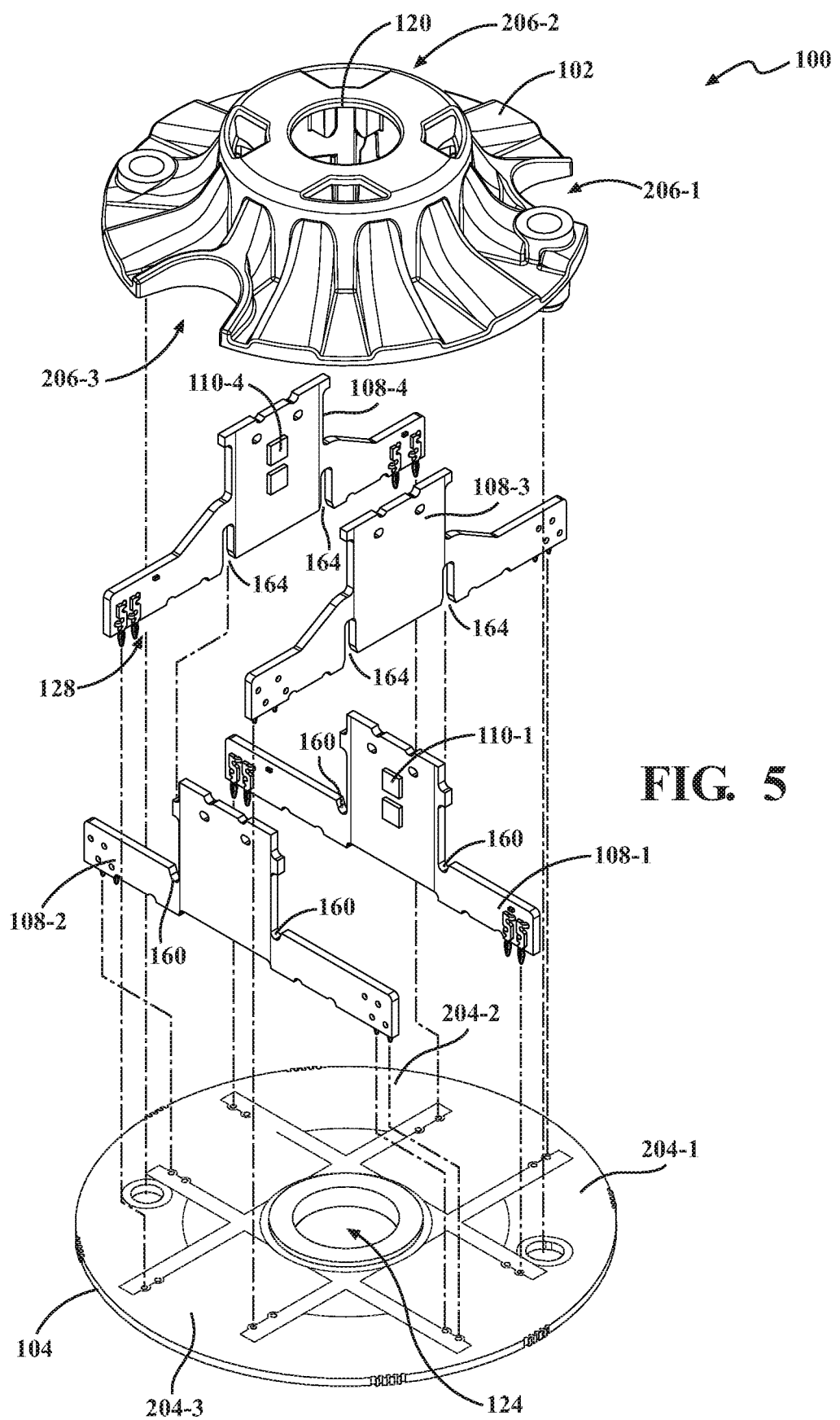
FIG. 5 depicts a first exploded view of the torque sensor module of FIG. 3 according to the teachings of the present disclosure.

The steering assembly 19 includes a steering column 21 coupled to a steering rack 23 which is coupled to ground engaging members 6. It is also contemplated that the steering assembly 19 may comprise, but is not limited to, any mechanical link between the steering column 21 and the ground engaging members 6. The ground engaging members 6 may include a sled or tire, as shown in FIGS. 1A and 1B, or other suitable ground engaging members. Generally, the ground engaging members 6 are coupled to steering rods 20. Movement of a user operated steering element 22, such as a steering wheel 22 in FIG. 4 or handlebars 4 as illustrated in FIGS. 1A and 1B, on the vehicle 1 causes movement of the steering rods 20 which turn the ground engaging members 6. It is additionally contemplated that the steering assembly 19 may be another suitable user operated steering assembly 19. The torque sensor assembly 10 may be utilized in a suitable component or system where an applied torque is measured. For example, the torque sensor assembly 10 may be utilized in, but not limited to, vehicular systems, such as electric power steering systems.

Figure 3:
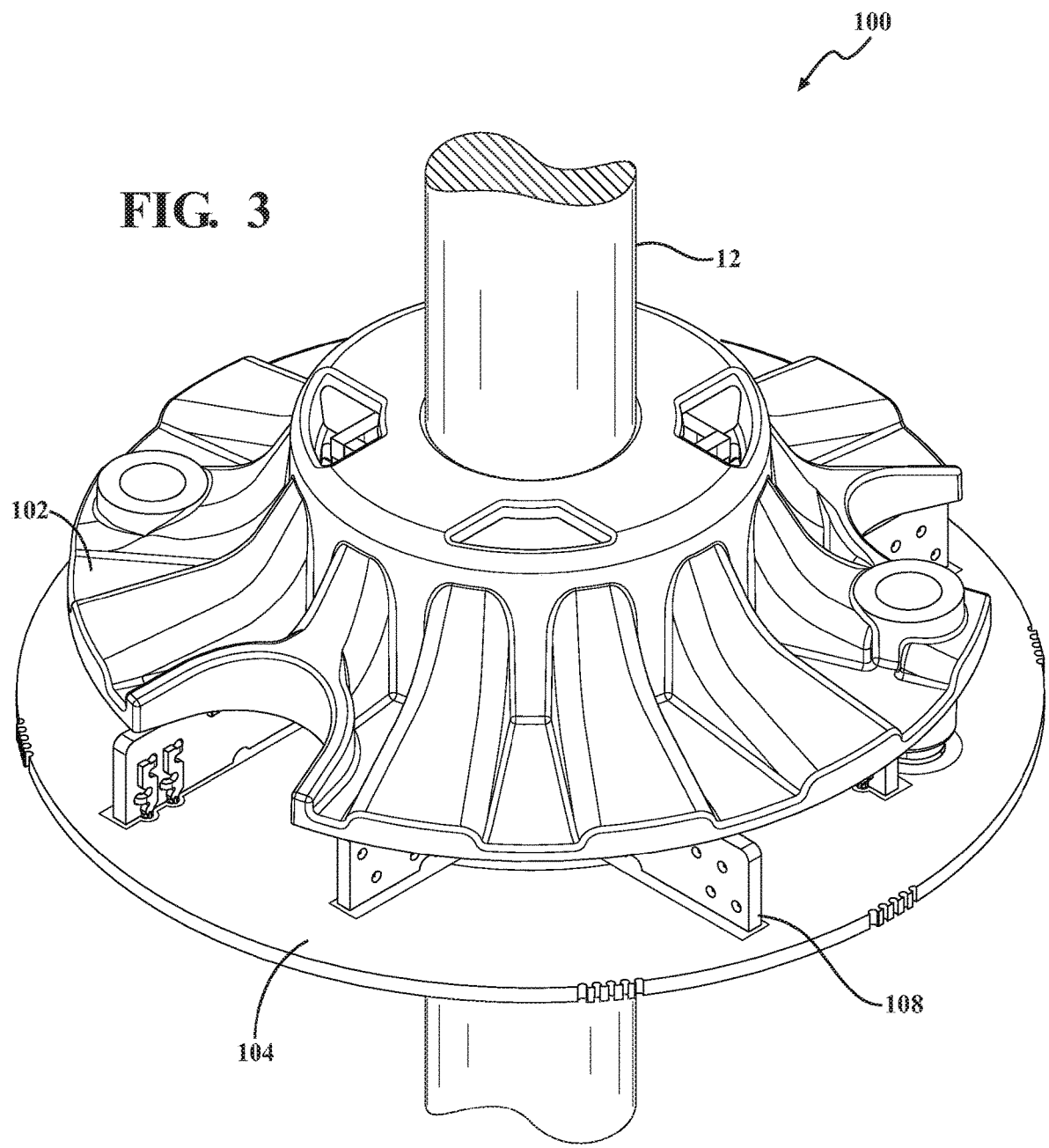
FIG. 3 depicts a perspective view of one example of the torque sensor module according to the teachings of the present disclosure.

With additional reference to FIG. 3, the torque sensor assembly 10 includes a torque sensor module 100, a housing, and a shaft 12. The torque sensor module 100 of the present disclosure provides precise alignment of a plurality of sensors around the shaft 12. The shaft 12 may extend through the housing and the torque sensor module 100 and include an emitter that causes the plurality of sensors (not shown in FIG. 3) to generate the plurality of signals based on movement of the shaft 12. For example, the emitter may be at least one region that is magnetoelastic and configured to generate a magnetic field in response to torque being applied. The at least one region may be magnetoelastic when the magnetic characteristics change in response to the applied torque.

With additional reference to FIGS. 4-10, the torque sensor module 100 is shown. The torque sensor module 100 includes a retainer 102, a main printed circuit board 104, and of auxiliary printed circuit boards (PCBs) 108. Each of the auxiliary PCBs 108 may include a at least one sensor 110 configured to generate a signal indicative of the magnitude of applied torque. The sensors 110 may include at least one of a Hall Effect sensor, a giant magnetoresistance magnetometer, an AMR magnetometer, a magneto-optical sensor, a search coil magnetic field sensor, a magnetodiode, a fluxgate magnetometer, or any other sensor suitable for sensing a magnetic field. The magnetic field generated by the at least one magnetoelastic region of the shaft 12. In the illustrated embodiment of FIG. 3, the shaft 12 is shown as the component that generates the sensor signals; however, it is understood that the component may be any suitable component and is not limited to the illustrated embodiment. A controller 72 is operatively connected to the sensors 110 and is configured to determine a magnitude of movement, such as an amount of applied torque based on the plurality of signals. The controller 72 may be disposed in any suitable location including on the main PCB 104, on the auxiliary PCBs 108, or at another suitable location.

The retainer 102 is configured to abut the auxiliary PCBs 108. The retainer 102 may be configured to at least partially maintain defined positions of the auxiliary PCBs 108 relative to each other or to apply a load on each of the auxiliary PCBs. The torque sensor module 100 defines a channel 116 to receive the shaft 12. With additional reference to FIG. 5, the retainer 102 may include a center aperture 120 and the main PCB 104 may also include a center aperture 124. The center aperture 120 of the retainer 102 may be axially aligned with the center aperture 124 of the main PCB 104 such that the center aperture 120 of the retainer 102 defines a beginning of the channel 116 while the center aperture 124 of the main PCB 104 defines an end of the channel 116.

The controller 72 may be configured to determine the magnitude of applied torque based on signals from each the at least one sensor of each of the plurality of auxiliary PCBs. The auxiliary PCBs 108 are interconnected together and coupled to the main PCB 104. The auxiliary PCBs 108 may be directly interconnected together or indirectly interconnected together with another component. The term interconnected together may refer to a mechanical coupling an electrical connection. The auxiliary PCBs 108 includes a first auxiliary PCB 108-1, a second auxiliary PCB 108-2, a third auxiliary PCB 108-3, and a fourth auxiliary PCB 108-4. Each of the auxiliary PCBs 108 is shown to include at least one sensor 110; however, it is contemplated that only one, two, or three of the auxiliary PCBs 108 may include the at least one sensor 110.

Figure 6:
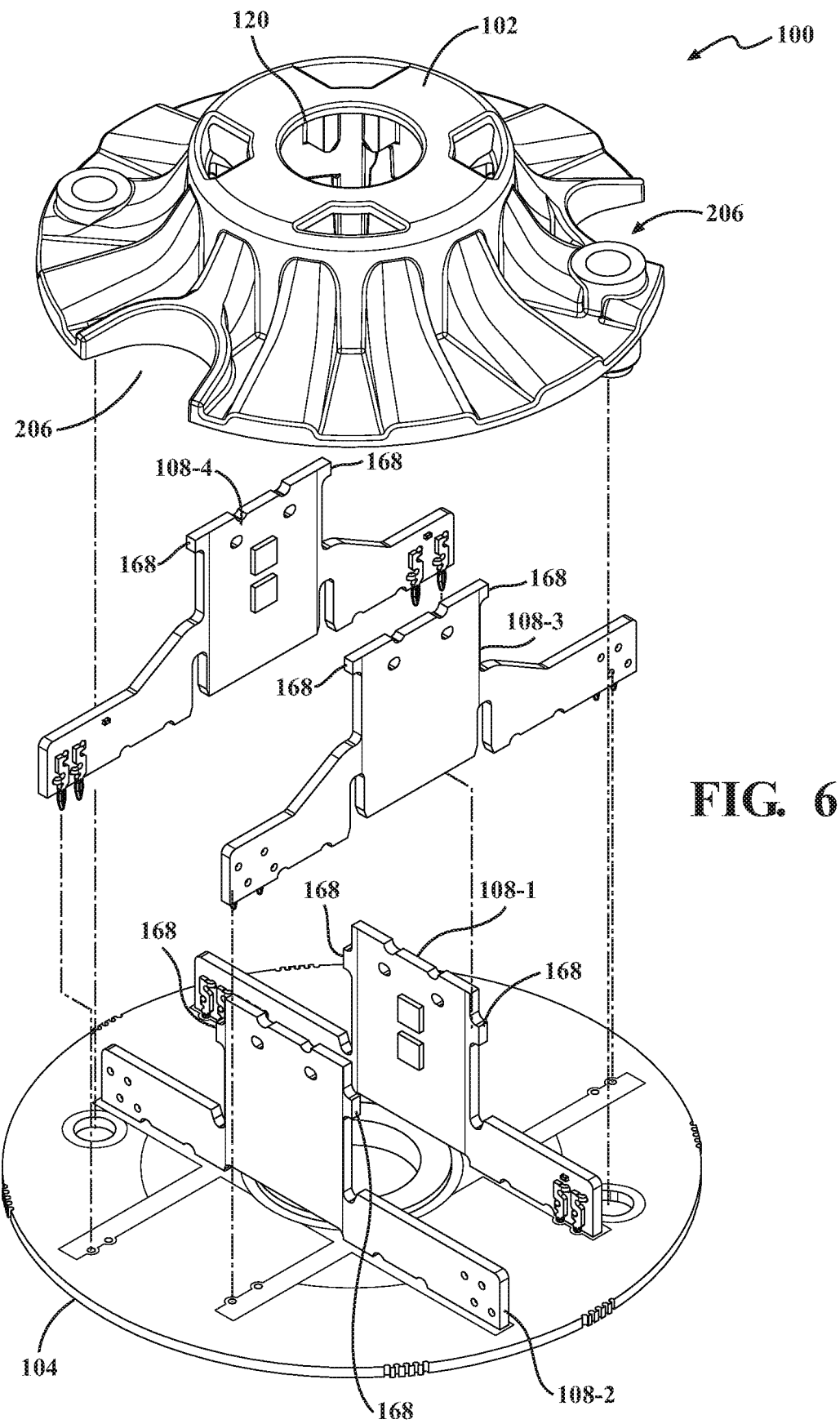
FIG. 6 depicts a second exploded view of the torque sensor module of FIG. 3 according to the teachings of the present disclosure.
Figure 7:
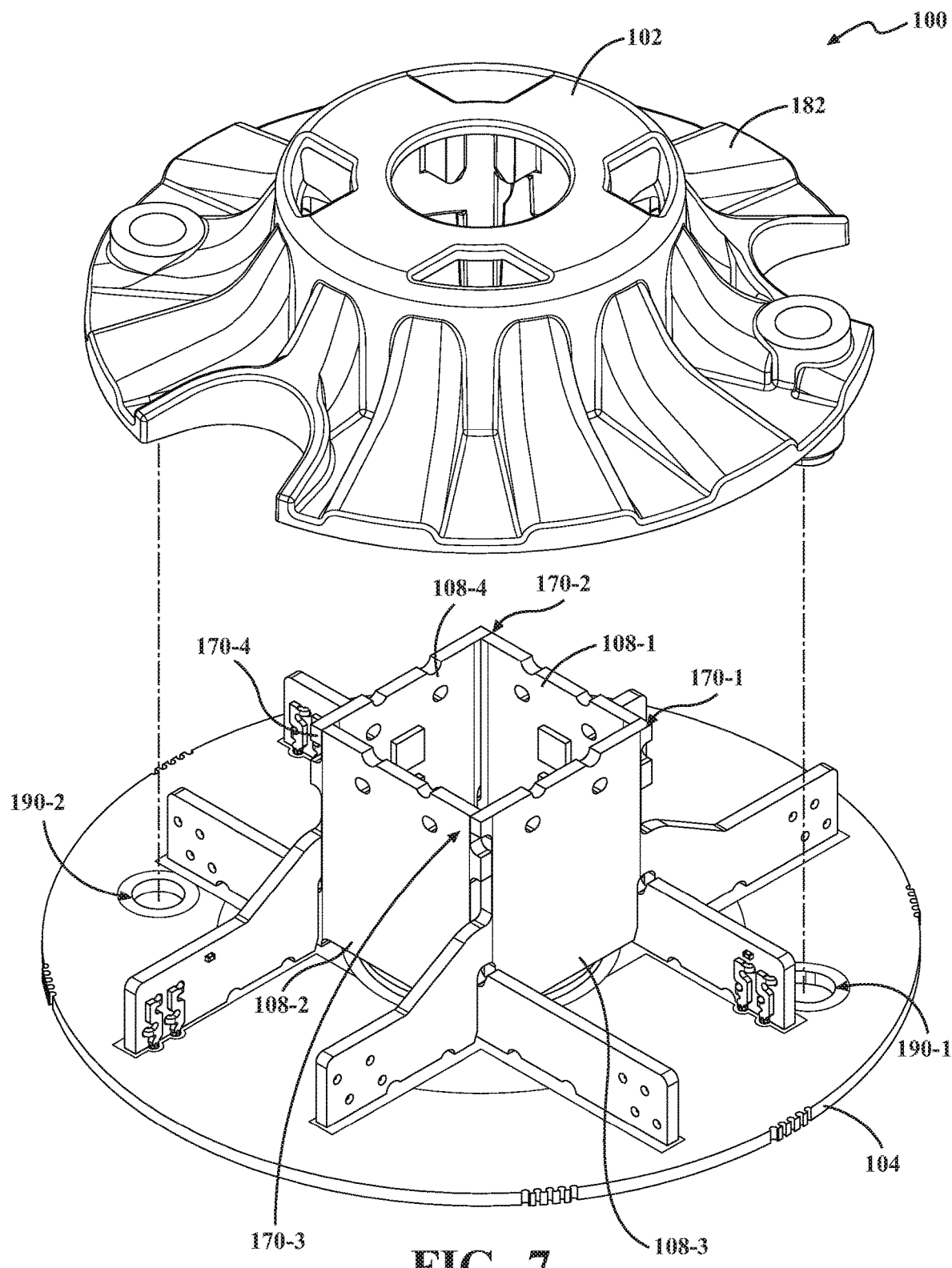
FIG. 7 depicts a third exploded view of the torque sensor module of FIG. 3 according to the teachings of the present disclosure.

With additional reference to FIGS. 6 and 7, the first auxiliary PCB 108-1 and the second auxiliary PCB 108-2 form a first pair of facing auxiliary PCBs 108 while the third auxiliary PCB 108-3 and the fourth auxiliary PCB 108-4 form a second pair of facing auxiliary PCBs 108. The first pair of facing auxiliary PCBs 108 and the second pair of facing auxiliary PCBs 108 are arranged perpendicular to each other. Stated differently, the first auxiliary PCB 108-1 is coupled on the main PCB 104 and perpendicular with respect to the third and fourth auxiliary PCB 108-4 while the second auxiliary PCB 108-2 is also coupled on the main PCB 104 and perpendicular with respect to the third and fourth auxiliary PCBs 108-3, 108-4. The relative position between the first or second pair of facing auxiliary PCBs 108 may be controlled by the retainer 102, the main PCB 104, the attachment elements 128 and/or by the size and shape of the auxiliary PCBs 108. As used throughout the disclosure, relative position may refer to the distance between facing auxiliary PCB pairs 108, such as the first pair of auxiliary facing PCBs 108 or the second pair of facing auxiliary PCBs 108, the alignment between the first pair of facing auxiliary PCBs 108 or the second pair of facing auxiliary PCBs 108, and/or parallelism between the first pair of facing auxiliary PCBs 108 and/or the second pair of facing auxiliary PCBs 108.

Figure 10A:
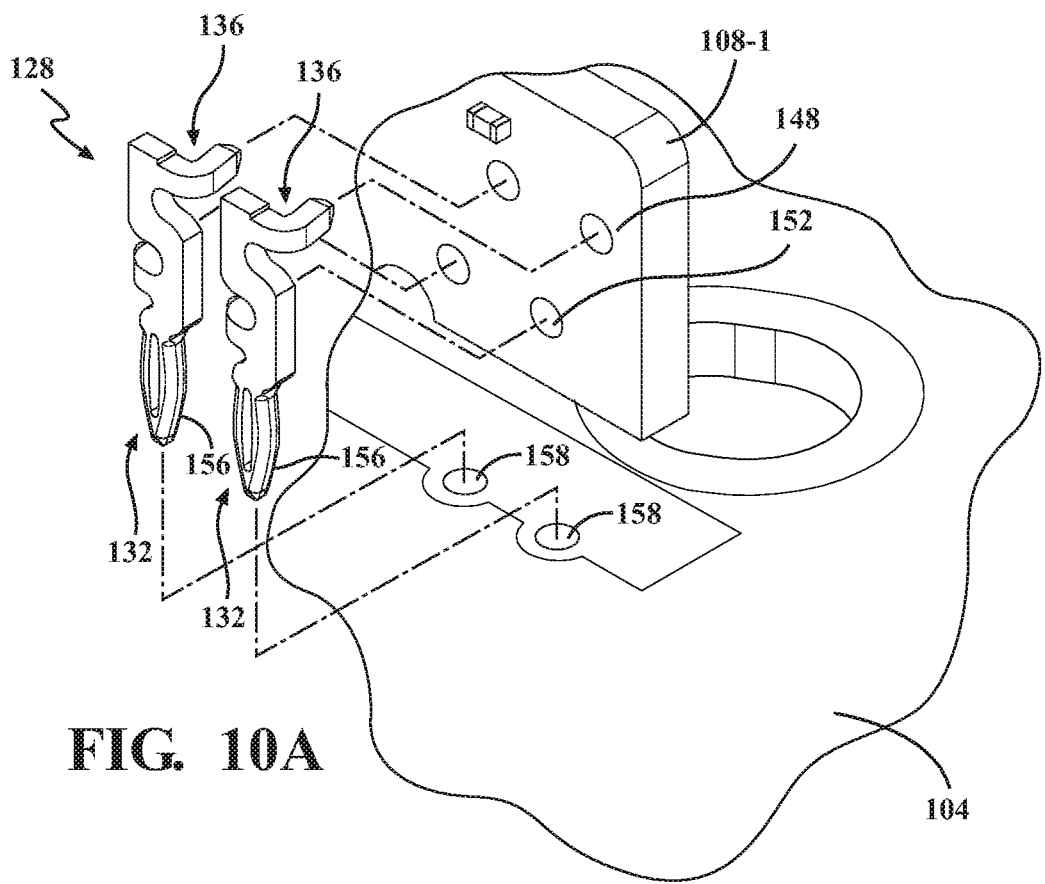
FIGS. 10A and 10B depict an exploded view of a connection interface of the torque sensor module of FIG. 3 according to the teachings of the present disclosure.

The auxiliary PCBs 108 are coupled to the main circuit PCB 104 by attachment elements 128 that assist in maintaining defined positions of the auxiliary PCBs 108 relative to each other. The attachment elements 128 electrically connect the auxiliary PCBs 108 to the main PCB 104. In the illustrated embodiments, the attachment elements 128 are depicted as press fit pins; however, the attachment elements 128 may be any suitable connectors. With reference to FIGS. 10A, a connection interface of the attachment elements 128, the first auxiliary PCB 108-1 and the main PCB 104 is shown. As shown in FIGS. 10 and 12, each of the attachment elements 128 may include a contact portion 132 and a press-fit portion 136. The press fit portion 136 and the contact portion 132 may include one or more elastic elements configured to deform in response to applied pressure.

The press fit portion of each of the attachment elements 128 may include a first male connector 140 and a second male connector 144 that are inserted into a first female connector 148 of the first auxiliary PCB 108-1 and a second female connector 152 of the first auxiliary PCB 108-1. The contact portion 132 of each of the of attachment elements 128 may also include a male connector 156 that is inserted into a female connector 158 of the main PCB 104. Some of the attachment elements 128 may electrically connect terminals of the auxiliary PCBs 108 to respective terminals of the main PCB 104. For example, the first auxiliary PCB 108-1 may be connected to the main PCB 104 via six attachment elements 128; however, only two or three of the attachment elements 128 may serve to electrically connect respective terminals of the first auxiliary PCB 108-2 to respective terminals of the main PCB 104. Electrical connection may refer to a power or data connection between the auxiliary PCBs 108 and the main PCB 104. While the example is provided that the attachment elements 128 couple the auxiliary PCBs 108 to the main PCB, it is understood that the auxiliary PCBs 108 may be coupled to the main PCB 104 in any suitable manner.

Figure 10B:
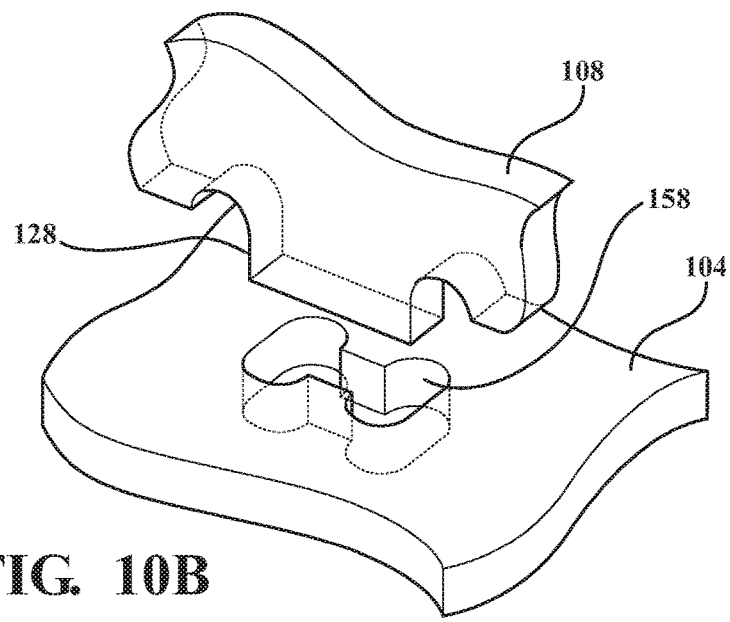

With reference to FIG. 10B, an alternate embodiment of the attachment elements 128 is shown. The attachment elements 128 need not be a separate component as the attachment elements may be integrally formed with the auxiliary PCBs 108. For example, a portion of each of the auxiliary PCBs 108 may be inserted directly into an aperture of the main PCB 104. In this embodiment, a portion of each of the attachment elements 128 may have at least a portion that is electrically conductive and capable of establishing an electrical connection with an aperture or female connector 158 of the main PCB 104.

Prior to coupling the auxiliary PCBs 108 to the main PCB 104, the attachment elements 128 are first coupled to the auxiliary PCBs 108. In the illustrated embodiments of FIGS. 5-7, each of the auxiliary PCBs 108 includes the plurality of attachment elements 128. While discussed above that the attachment elements 128 includes six attachment elements, it is contemplated that the attachment elements 128 may include any number of attachment elements. Once the attachment elements 128 are coupled to the auxiliary PCBs 108, the attachment elements 128 of the first and second auxiliary PCBs 108-1, 108-2 are aligned and inserted into respective female connectors of the main PCB 104.

With reference back to FIG. 5, the first auxiliary PCB 108-1 and second auxiliary PCB 108-2 may include notches 160 while the third and fourth auxiliary PCB 108-3, 108-4 include grooves 164. As shown in FIG. 6, the first and second auxiliary PCBs 108-1, 108-2 are coupled to the main PCB 104 first, prior to coupling the third and fourth auxiliary PCBs 108-3, 108-4. The grooves 164 of the third and fourth auxiliary PCBs 108-3, 108-4 are mated with the notches 160 of the first and second auxiliary PCBs 108-1, 108-2 when the third and fourth auxiliary PCBs 108-3, 108-4 are coupled to the main PCB 104. Each of the auxiliary PCBs 108 includes a plurality of tabs 168. Each of the plurality of tabs 168 engages with an adjacent auxiliary PCB 108. For example, the plurality of tabs 168 of the first auxiliary PCB 108-1 engages with the third auxiliary PCB 108-3 and the fourth auxiliary PCB 108-4.

With reference to FIG. 7, in the illustrated embodiment, corners 170 are formed where the auxiliary PCBs 108 are mated together. A first corner 170-1 is formed where the first auxiliary PCB 108-1 mates with the third auxiliary PCB 108-3, a second corner 170-2 is formed where the first auxiliary PCB 108-1 mates with the fourth auxiliary PCB 108-4, a third corner 170-3 is formed where the second auxiliary PCB 108-2 mates with the third auxiliary PCB 108-3, and a fourth corner 170-4 is formed where the second auxiliary PCB 108-2 mates with the fourth auxiliary PCB 108-4.

Figure 8:
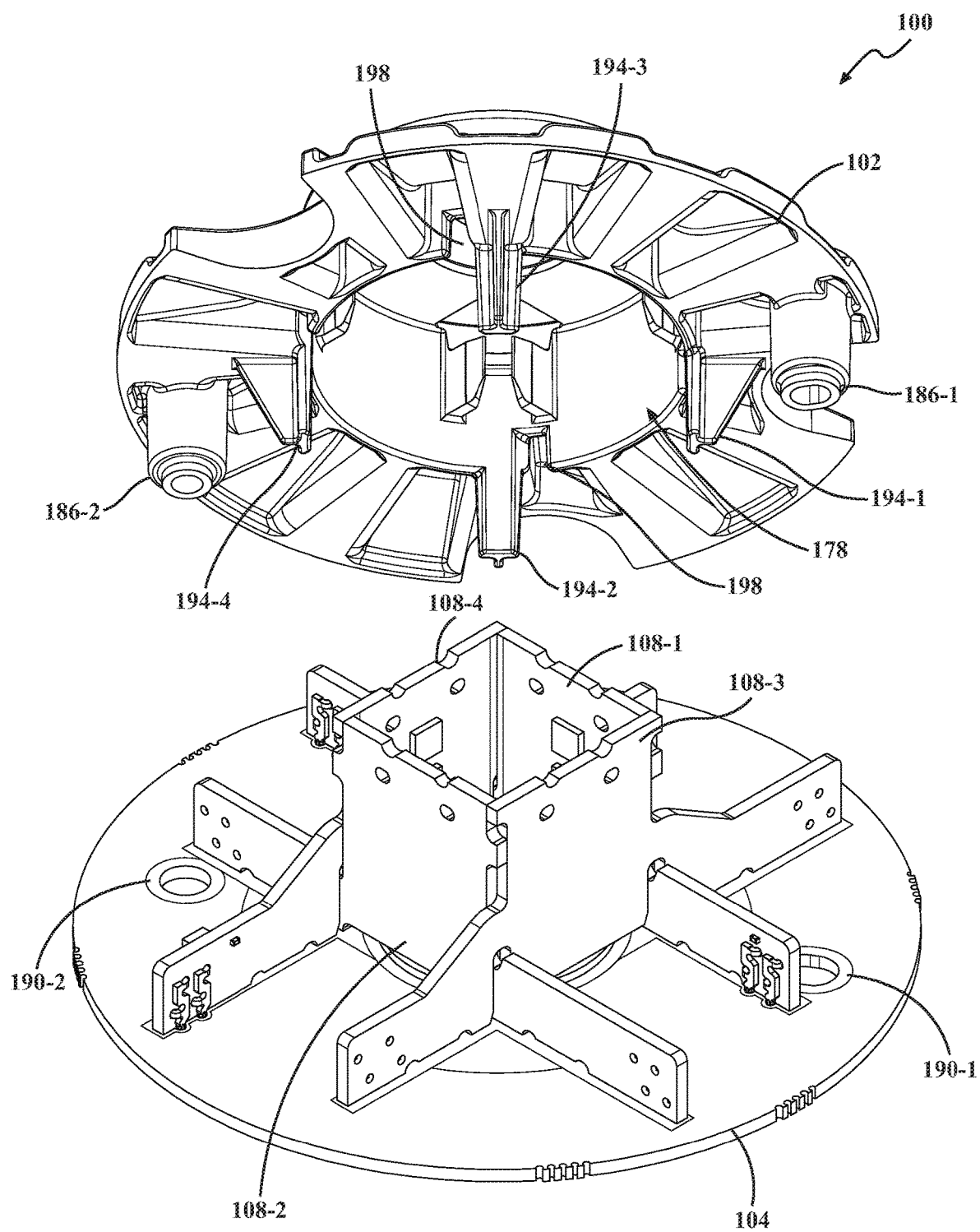
FIG. 8 depicts a fourth exploded view of the torque sensor module of FIG. 3 according to the teachings of the present disclosure.
Figure 9:
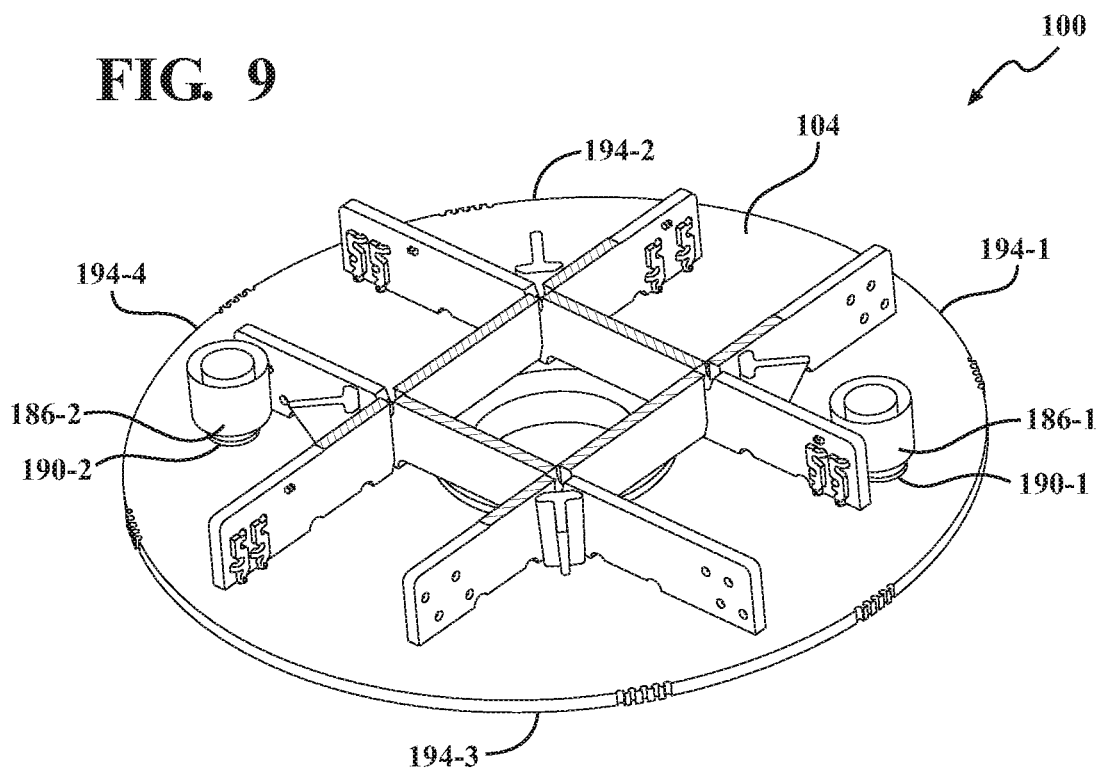
FIG. 9 depicts a first cross sectional view of the torque sensor module of FIG. 3 according to the teachings of the present disclosure.

With reference to FIGS. 7 and 8, the retainer 102 is formed to define a cavity 178 in which at least a portion of the auxiliary PCBs 108 are disposed inside of the cavity 178. The retainer 102 is also formed to include a flange portion 182 and sleeves 186. A first sleeve 186-1 and a second sleeve 186-2 extend from an underside of the flange portion 182 of the retainer 102. The first sleeve 186-1 is inserted into a first aperture 190-1 and mate with a portion of the main PCB 104 surrounding the first aperture 190-1. The second sleeve 186-1 is inserted into the second aperture 190-2 and mate with a portion the main PCB 104 surrounding the second aperture 190-2. The first sleeve 186-1 and the second sleeve 186-2 at least partially secure the retainer 102 to the main PCB 104. The retainer 102 may also include posts 194, such as a first post 194-1, a second post 194-2, a third post 194-3, and a fourth post 194-4 that selectively engage the main PCB 104 when the retainer 102 is secured to the auxiliary PCBs 108 to provide support for the retainer 102. The retainer 102 may be formed to include slots 198. A portion of each of the auxiliary PCBs 108 is inserted into a respective slot 198 in order to allow the retainer 102 to be secured to the main PCB 104.

Figure 11:
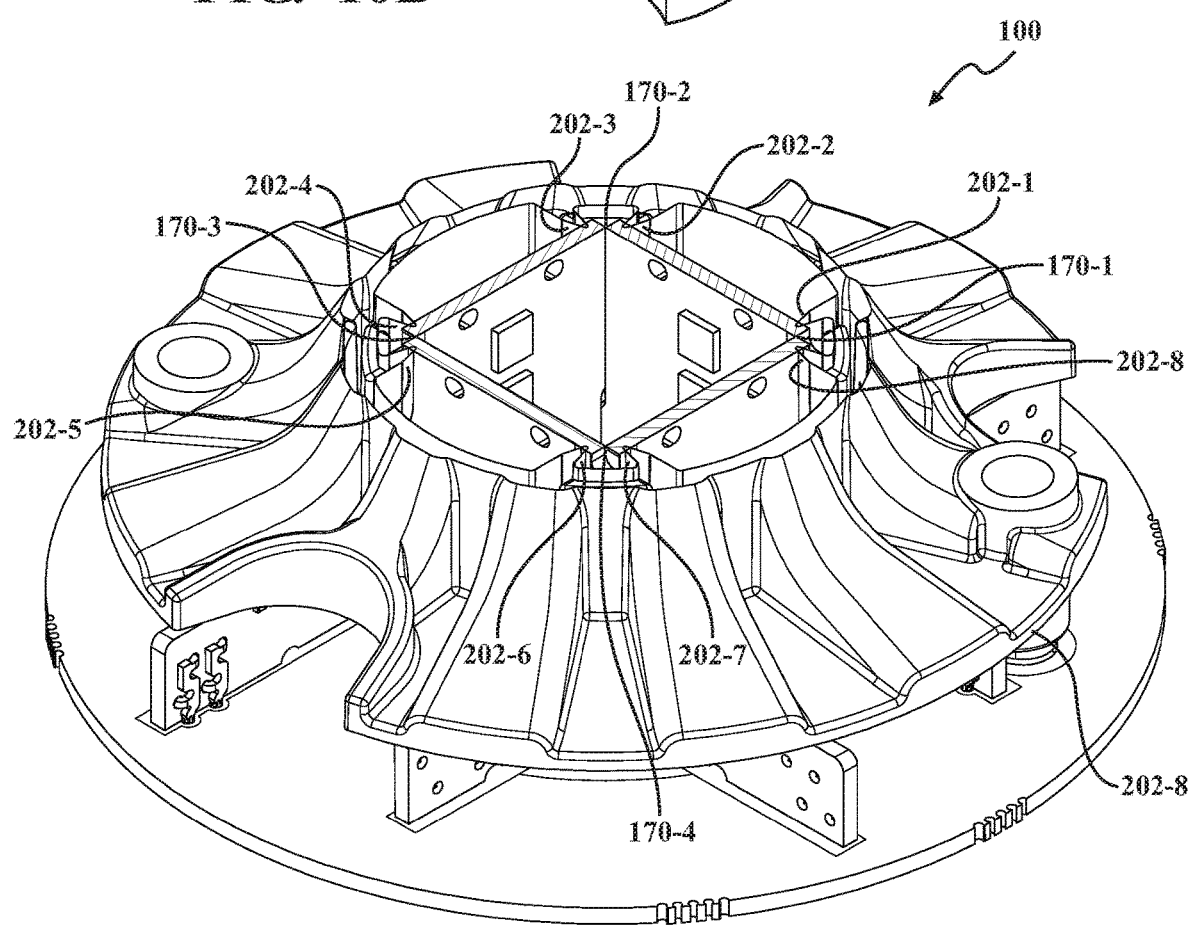
FIG. 11 depicts a second cross sectional view of the torque sensor module of FIG. 3 according to the teachings of the present disclosure.

With reference to FIG. 11, the retainer 102 may also include retention members 202 that secure the retainer 102 to the auxiliary PCBs 108. The retention members 202 may be integrally formed with an inner surface of the retainer 102. The retention members 202 may include a first retention member 202-1, a second retention member 202-2, a third retention member 202-3, a fourth retention member 202-4, a fifth retention member 202-5, a sixth retention member 202-6, a seventh retention member 202-7, and an eighth retention member 202-8. The first and eight retention members 202-1, 202-8 may engage the first corner 170-1 of the auxiliary PCBs 108, the second and third retention members 202-2, 202-3 may engage the second corner 170-2 of the auxiliary PCBs 108, the fourth and fifth retention members 202-4, 202-5 may engage the fourth corner 170-4 of the auxiliary PCBs 108, and the sixth and seventh retention members 202-6, 202-7 may engage the third corner 170-3 of the auxiliary PCBs 108. The retention members 202 may be flexible and/or deformable. As discussed previously, the engagement of the auxiliary PCBs 108 with the retainer 102 and the main PCB 104 helps to maintain defined positions of the auxiliary PCBs 108 relative to each other.

With reference back to FIG. 5, as shown in the illustrated embodiment, the main PCB 104 may include openings 204, such as a first opening 204-1, a second opening 204-2, and a third opening 204-3 that define coupling locations for the torque sensor module 100 to be coupled to a housing of the torque sensor assembly 10. The retainer 102 may include recessed portions 206, such a first recessed portion 206-1, a second recessed portion 206-2, and a third recessed portion 206-3, that expose the first, second, and third openings 204-1, 204-2, 204-3 to allow access to the openings 204 for coupling the torque sensor module 100 to the housing.

With reference to FIGS. 13 through 19, a second embodiment of the sensor module 100 is shown. Like elements will be identified with the same reference numbers and the discussion will focus on the differences between the second embodiment of the torque sensor module 100 and the first embodiment. As shown in FIG. 14, the retainer 102 may include a top member 214 and an outer member 210. The top member 214 may include a center aperture 218 and the outer member 210 may include a center aperture 222 that are aligned with the center aperture 124 of the main PCB 104. The shaft may be placed through the center apertures 222, 218, 124.

The auxiliary PCBs 108 are coupled between the main PCB 104 and the top member 214. For example, a bottom end of the second auxiliary PCB 108-2 is coupled to the main PCB 104 and a top end of the second auxiliary PCB 108-2 is coupled to the top member 214. Similarly, a bottom end of the second auxiliary PCB 108-2 is coupled to the main PCB 104 and a top end of the second auxiliary PCB 108-2 is coupled to the top member 214. The top ends of the first and second auxiliary PCBs 108-1, 108-2 may be coupled to the top member 214 via the attachment elements 128 or in another suitable manner. The outer member 210 has a cylindrical shape and is disposed over the top member 214, the auxiliary PCBs 108, and the main PCB 104.

Figure 20:
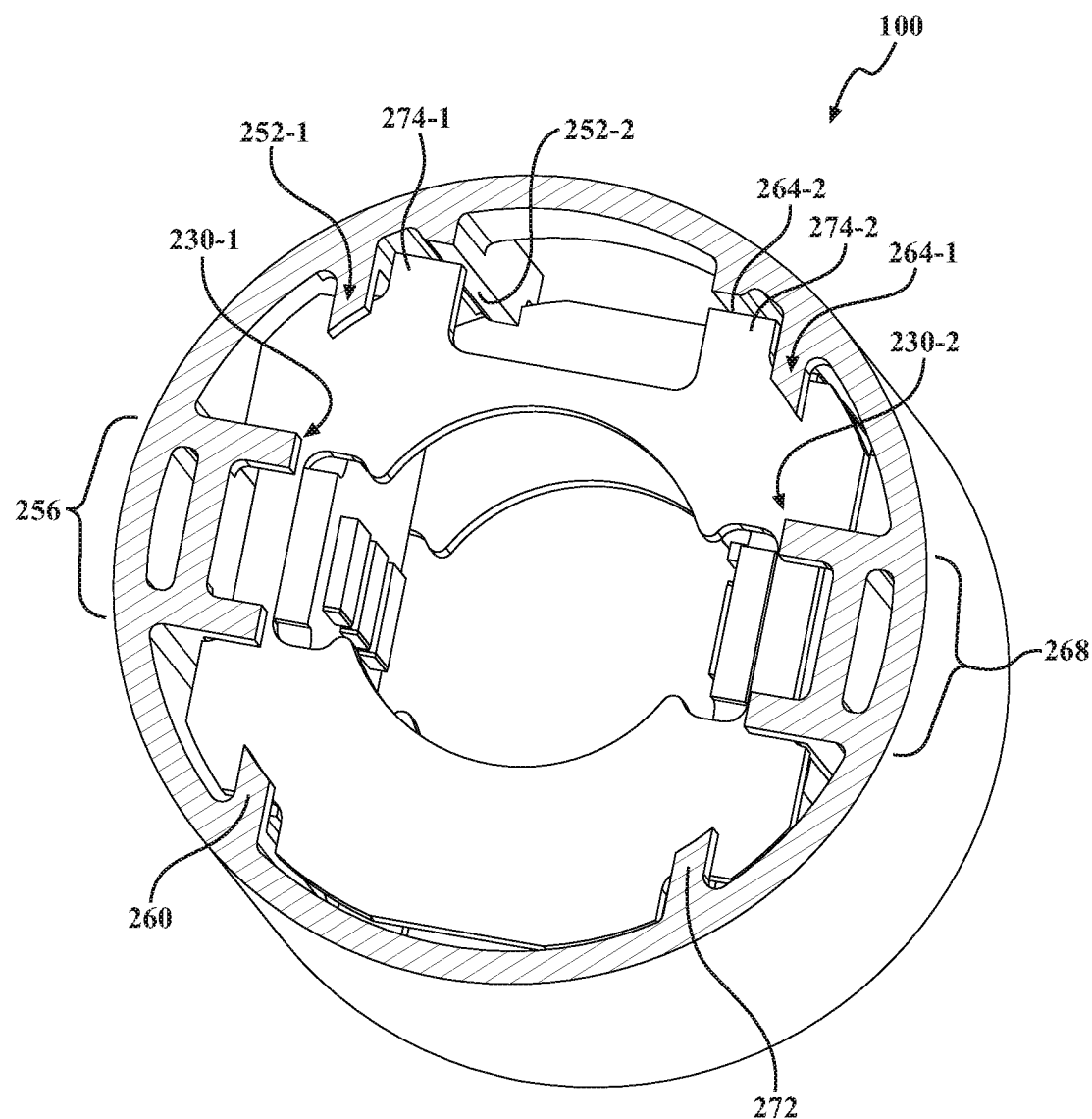
FIG. 20 depicts a second cross sectional view of the torque sensor module of FIG. 13 according to the teachings of the present disclosure.

With particular reference to FIGS. 14 and 20, the outer member 210 of the retainer 102 may include lips 226, such as a first lip 226-1 and a second lip 226-2. An underside of the first lip 226-1 may include a first plurality of extensions 230-1 and an underside of the second lip 226-2 may include a second plurality of extensions 230-2. The first and second plurality of extensions 230-1, 230-2 engage with the top member 214 of the retainer 102.

Figure 16:
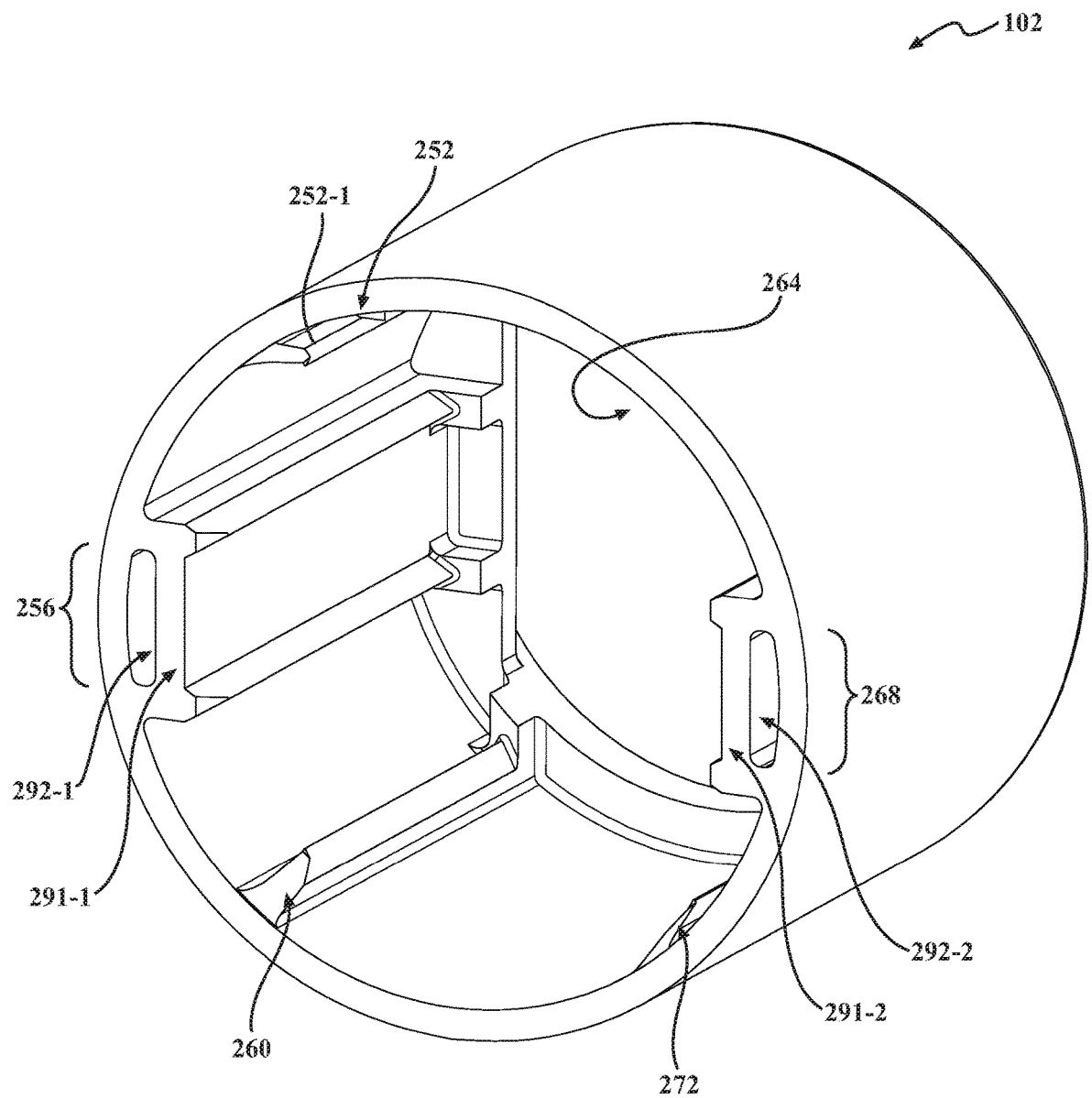
FIG. 16 depicts a first perspective of a retainer of the torque sensor module of FIG. 13 according to the teachings of the present disclosure.
Figure 17:
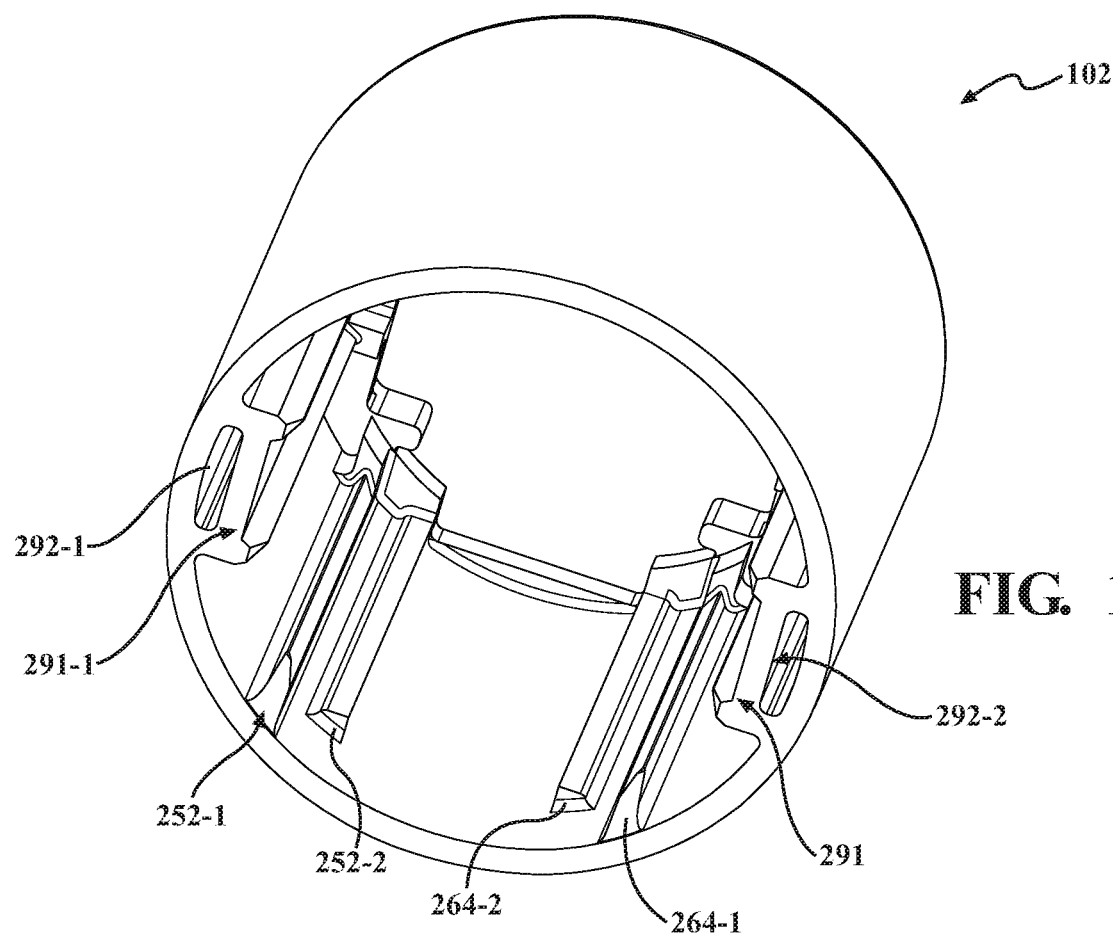
FIG. 17 depicts a second perspective of a retainer of the torque sensor module of FIG. 13 according to the teachings of the present disclosure.
Figure 18:
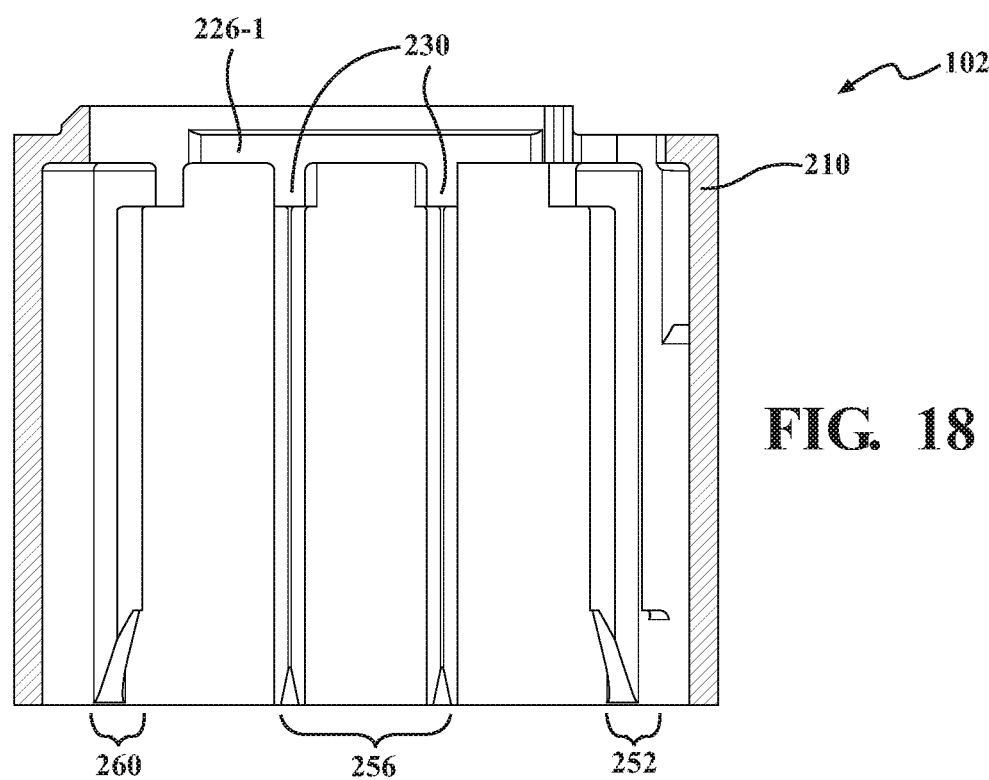
FIG. 18 depicts a cross sectional view of a retainer of the torque sensor module of FIG. 13 according to the teachings of the present disclosure.
Figure 19:
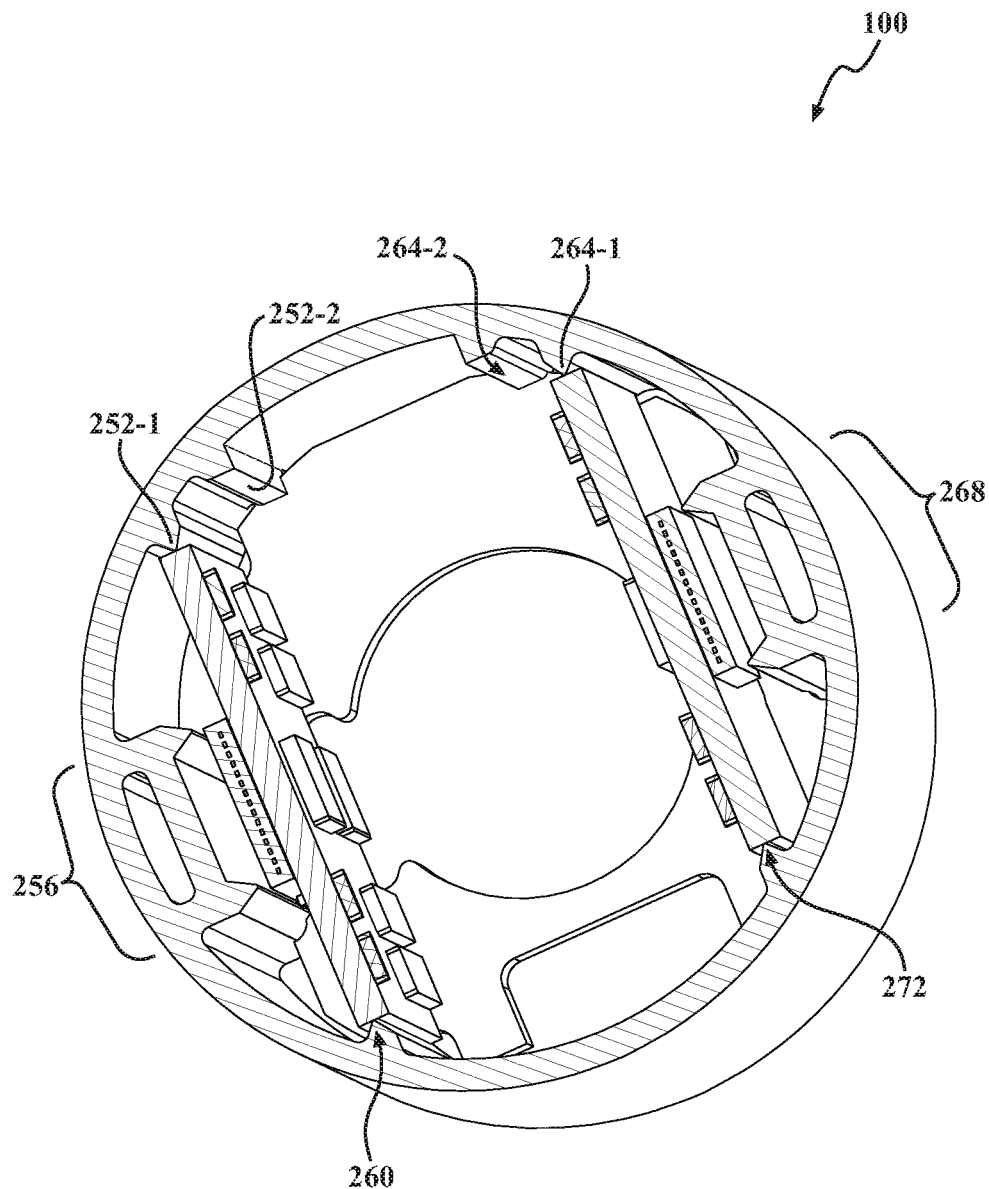
FIG. 19 depicts a first cross sectional view of the torque sensor module of FIG. 13 according to the teachings of the present disclosure.

With particular reference to FIGS. 16 and 20, in the second embodiment of the torque sensor module 100, the retention members 202 are shown as ribs. Such ribs may be integrally formed with an inner surface of the outer member 210 of the retainer 102. The ribs may include a first portion of ribs 252, a second portion of ribs 256, a third portion of the ribs 260, a fourth portion of ribs 264, a fifth portion of ribs 268, and a sixth portion of ribs 272. The ribs 252-272 engage with the top member 214 of the retainer 102, the main PCB 104 and the auxiliary PCBs 108-1, 108-2. The ribs 252-272 may extend a substantial portion of a height of the outer member 210.

Figure 15:
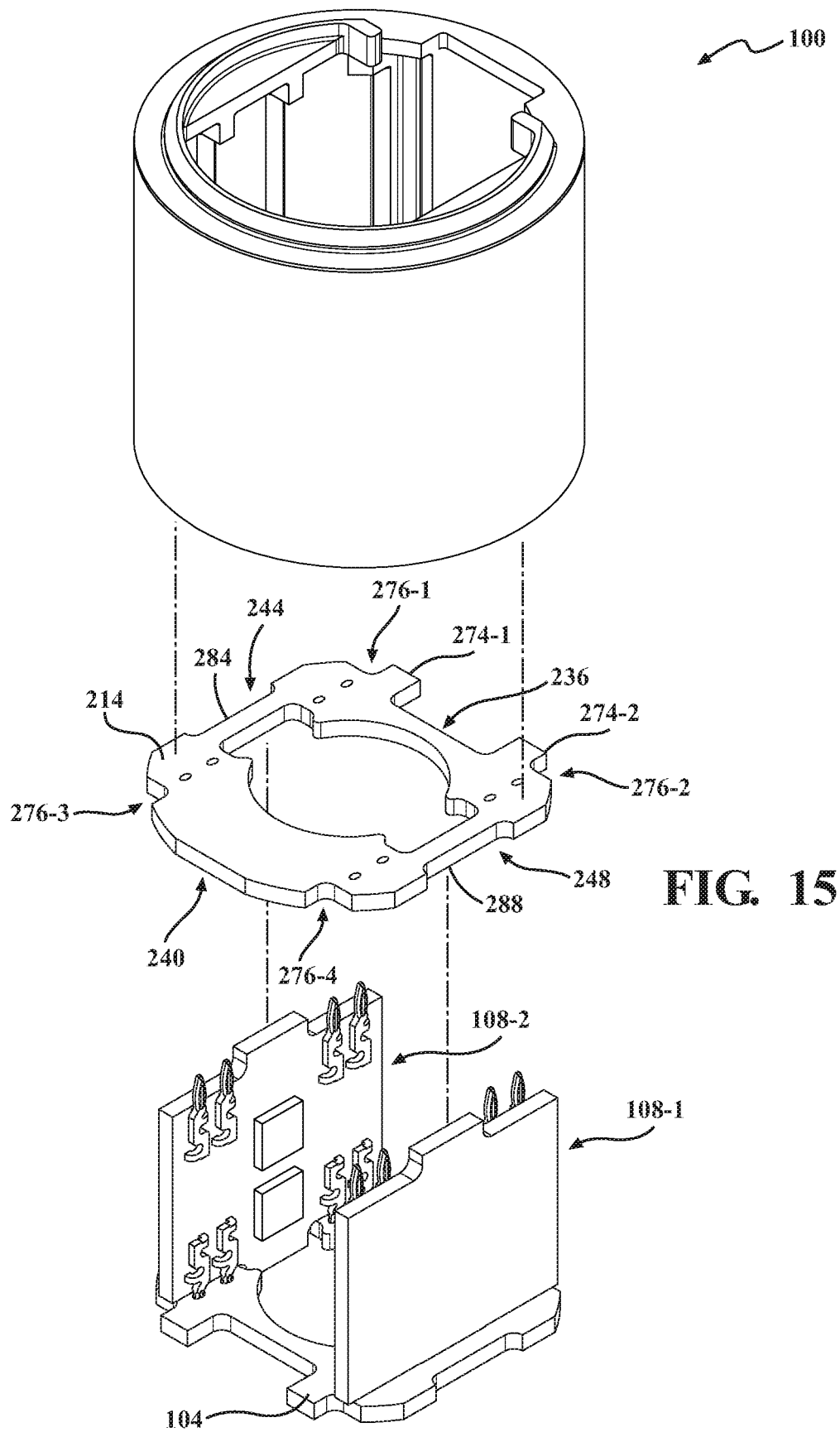
FIG. 15 depicts a second exploded view of the torque sensor module of FIG. 13 according to the teachings of the present disclosure.

With additional reference to FIG. 15, the top member 214 may include a first side 236, a second side 240, a third side 244, and a fourth side 248. The first side 236 may include fingers 274, such as a first finger 274-1 and a second finger 274-2. The first and second fingers 274-1, 274-2 may be partially positioned in between with the first and fourth portion of ribs 252, 264. For example, a portion of the first finger 274-1 may be positioned in between the first portion of ribs 252 and a portion of the second finger 274-2 may be positioned in between the fourth portion of ribs 264. The first side 236 may also include a first notch 276-1 and a second notch 276-2. A first rib 252-1 of the first portion of ribs 252 may be seated within the first notch 276-1 and contact or engage the second auxiliary PCB 108-2. A first rib 264-1 of the fourth portion of ribs 264 may be seated within the second notch 276-2 and contact or engage the first auxiliary PCB 108-1.

The second side 240 of the top member 214 is opposite the first side 236 and includes notches 276, such as a third notch 276-3 and a fourth notch 276-4. Between the third notch 276-3 and the fourth notch 276-4 is a middle portion that is complementary in shape to the outer member 210. The third portion (i.e., a single rib) of ribs 260 may be seated within the third notch 276-3 and may contact or engage the second auxiliary PCB 108-1. The sixth portion (i.e., a single rib) of ribs 272 may be seated within the fourth notch 276-4 and may contact or engage the first auxiliary PCB 108-2. The third and fourth sides 244, 248 of the top member 214 may each include a recessed portion 284, 288 that engages with the second and fifth portion of ribs 256, 264.

With particular reference to FIG. 16, the second portion of ribs 256 includes a pair of ribs connected by a first wall 291-1. The first wall 291-1 is offset from the inner surface of the outer member 210 by a predetermined distance such that a first cavity 292-1 is formed between the wall 291-1 and the inner surface of the outer member 210. The fifth portion of ribs 268 includes a pair of ribs connected by a second wall 291-2. The second wall 291-2 is offset from the inner surface of the outer member 210 by a predetermined distance such that a second cavity 292-2 is formed between the wall 291-2 and the inner surface of the outer member 210. The second portion of ribs 256 engages with the recessed portion 284 of the third side 244 and the fifth portion of ribs 268 engages with the recessed portion 288 of the fourth side 248.

With particular reference to FIG. 14, the top member 214 and the main PCB 104 may be congruent in shape but oriented in opposite directions. For example, for the main PCB 104, fingers 290, such as a first finger 290-1 and a second finger 290-2 may be disposed, partially or fully, between the third portion of ribs 260 and the sixth portion of ribs 272. The second portion of ribs 256 may engage a second recessed portion 296 of the main PCB 104 and the fifth portion of ribs 268 may engage a first recessed portion 294 of the main PCB 104. The first rib 252-1 of the first portion of ribs 252 may seat within a fourth notch 198-4 of the main PCB 104 and the first rib 264-1 of the fourth portion of ribs 264 may seat within a third notch 198-3 of the main PCB 104. The third portion of ribs 260 may seat within a second notch 198-2 of the main PCB 104 and the sixth portion of ribs 272 may seat within a first notch 198-1 of the main PCB 104.

Figure 21:
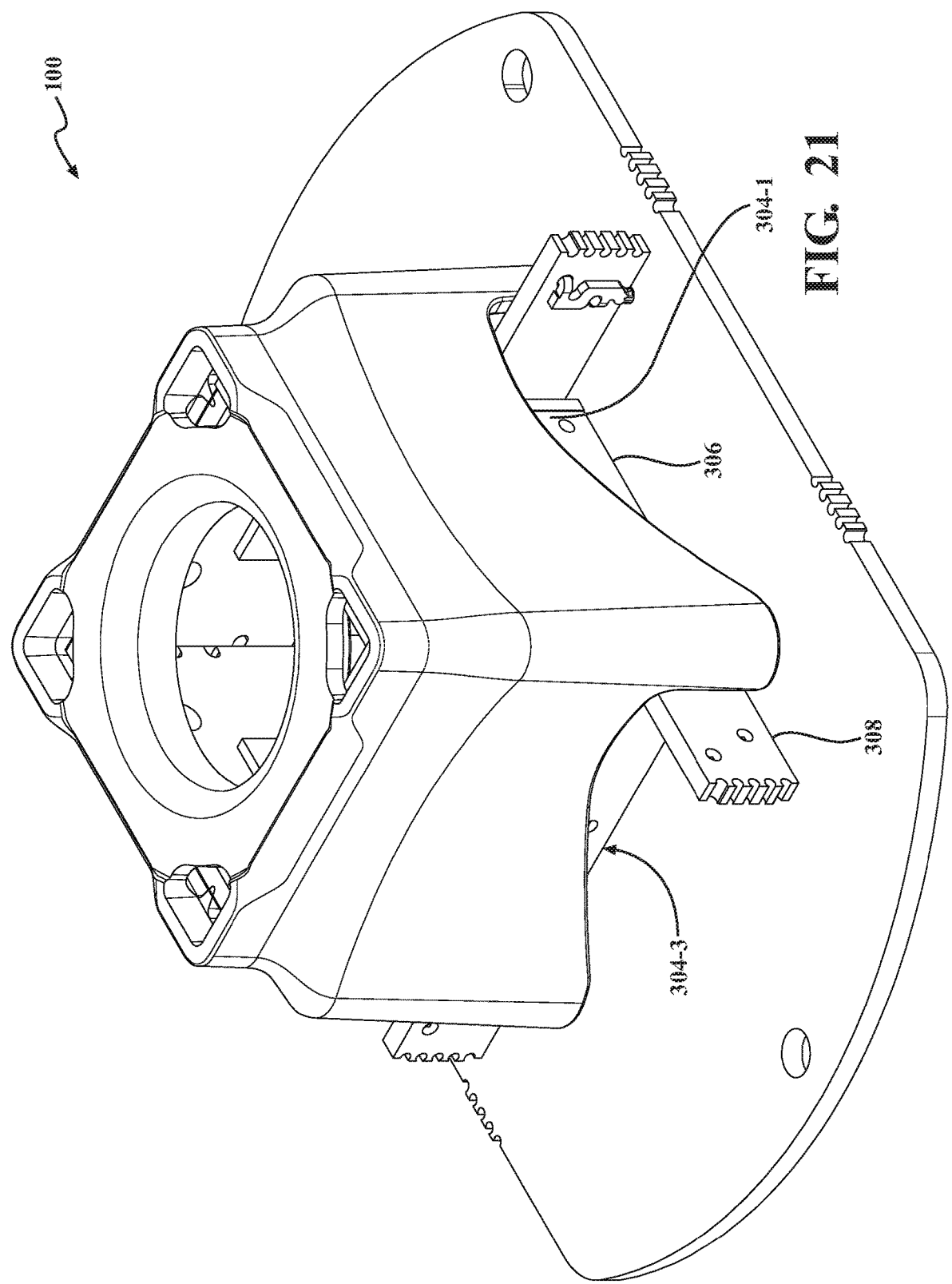
FIG. 21 depicts a perspective view of a third embodiment of a torque sensor module according to the teachings of the present disclosure.
Figure 22:
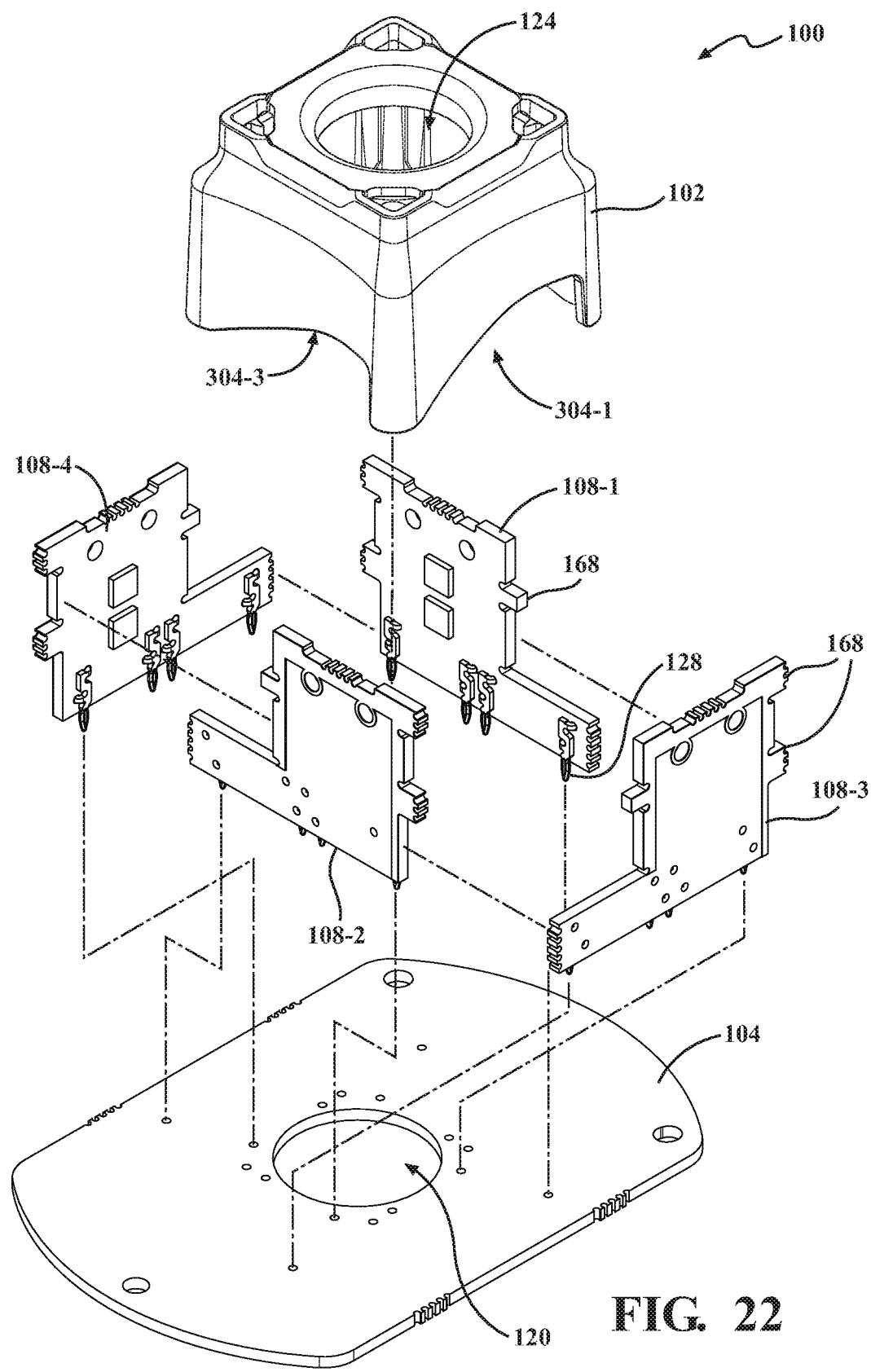
FIG. 22 depicts a first exploded view of the torque sensor module of FIG. 21 according to the teachings of the present disclosure.
Figure 23:
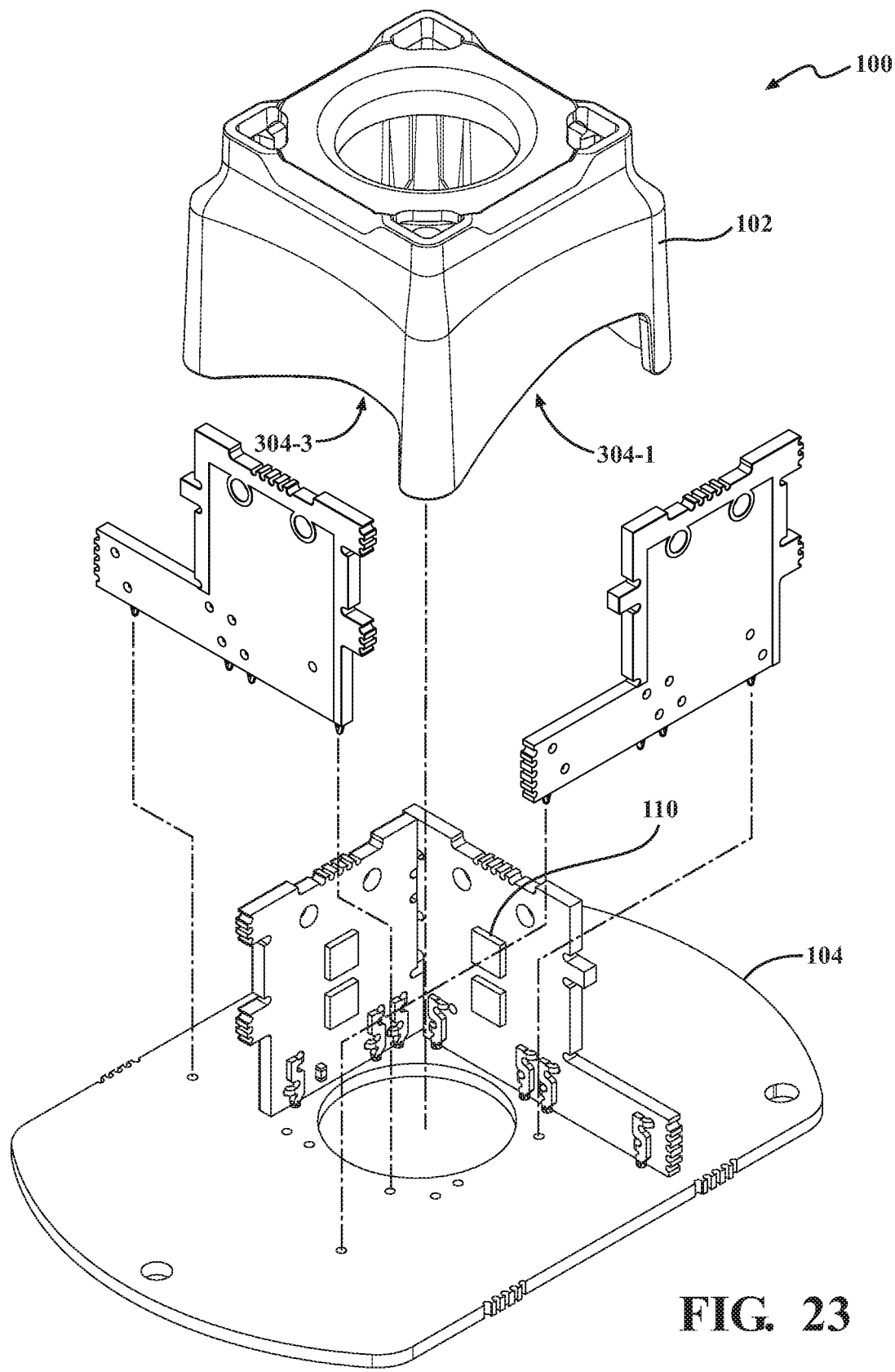
FIG. 23 depicts a second exploded view of the torque sensor module of FIG. 21 according to the teachings of the present disclosure.
Figure 24:
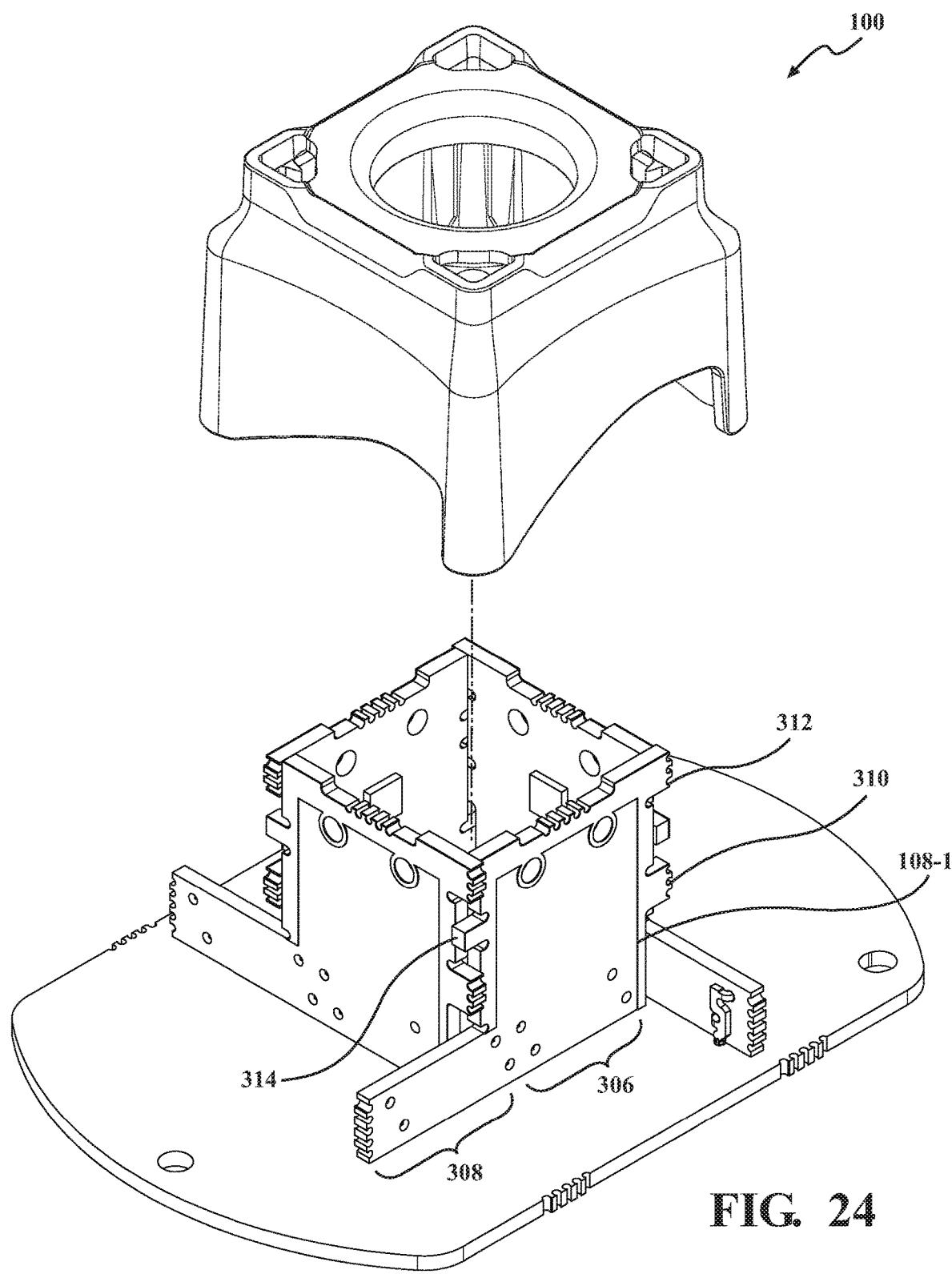
FIG. 24 depicts a third exploded view of the torque sensor module of FIG. 21 according to the teachings of the present disclosure.

With reference to FIGS. 21-26, a third embodiment of the torque sensor module 100 is shown. Like elements will be identified with the same reference numbers and the discussion will focus on the differences between the third embodiment and the first embodiment. As shown in the illustrated embodiments, the retainer 102 may include first, second, third, and fourth sides with each side having a recessed portion 304. For example, the first side may have a first recessed portion 304-1, the second side may have a second recessed portion (not shown), the third side may have a third recessed portion 304-3, and the fourth side may have a fourth recessed portion (not shown). With particular reference to FIGS. 21 and 24, each of the auxiliary PCBs 108 may include a first portion 306 and a second portion 308. The recessed portion 304 for each side of the retainer 102 allows for a respective second portion 308 of each of the auxiliary PCBs 108 to extend from underneath the retainer 102. The second portion 308 of each of the auxiliary PCBs 108 may engage with an adjacent auxiliary PCB 108 and provide support for a respective auxiliary PCB 108. Some of the attachment elements 128 may be disposed on the second portion 308. For example, as shown in the illustrated embodiments, three attachment elements 128 are disposed on the second portion 108 and the other three attachment elements 128 are disposed on the first portion 306. Both the first and second portion 306, 308 are coupled to the main PCB 104.

With particular reference to FIG. 24, one side of the first portion 306 of each of the auxiliary PCBs 108 may include a first tab 310 and a second tab 312 while the other side of the first portion of each of the auxiliary PCBs 108 includes a third tab 314. The tabs 310, 312, 314 engage with respective adjacent auxiliary PCBs 108. For example, the first tab 310 and the second tab 312 of the first auxiliary PCB 108-1 engage with one of the auxiliary PCBs 108 while the third tab 314 of the first auxiliary PCB 108-1 engages with another one of the auxiliary PCBs 108.

Figure 25:
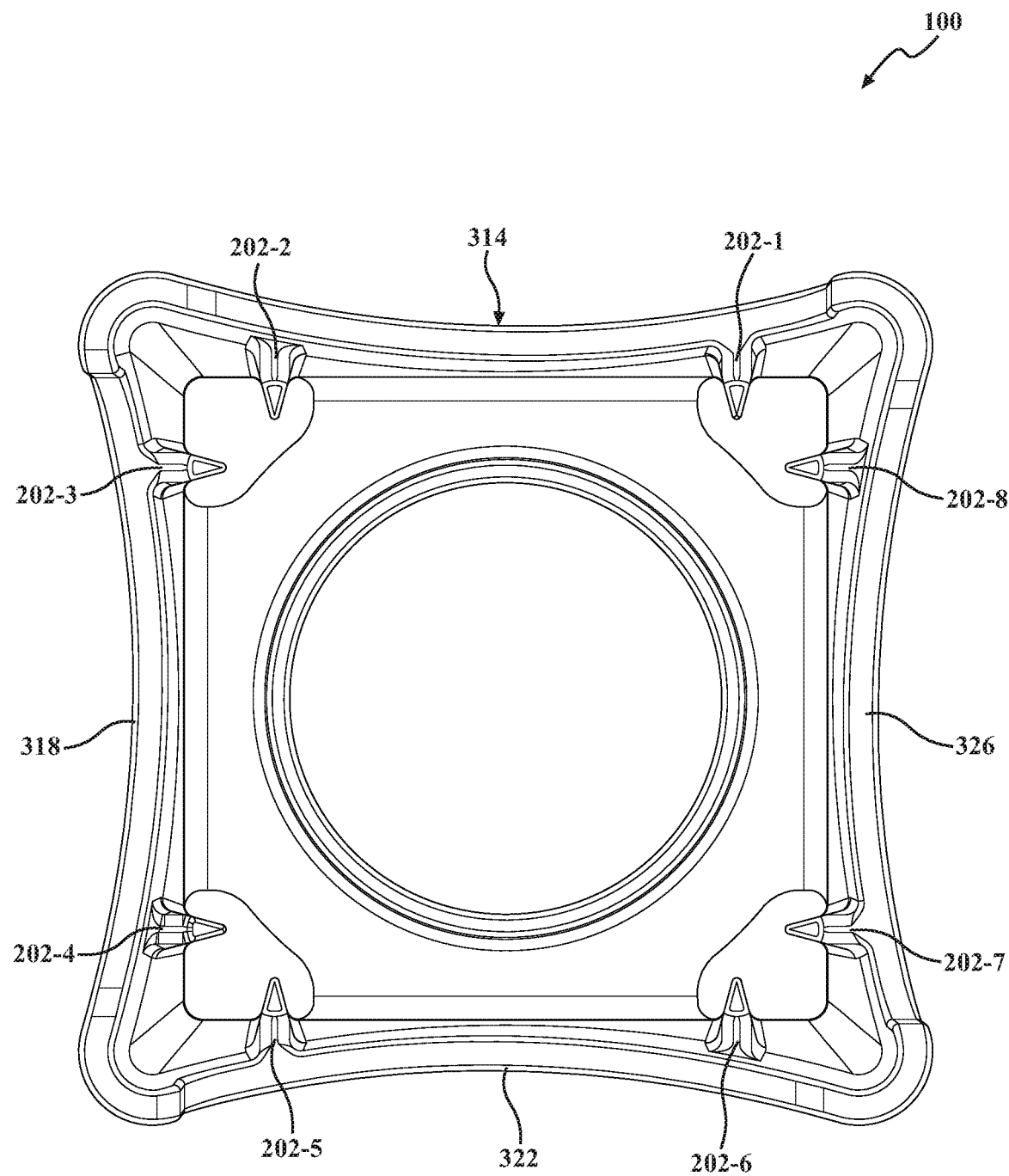
FIG. 25 depicts an underside view of a retainer of the torque sensor module of FIG. 21 according to the teachings of the present disclosure.
Figure 26:
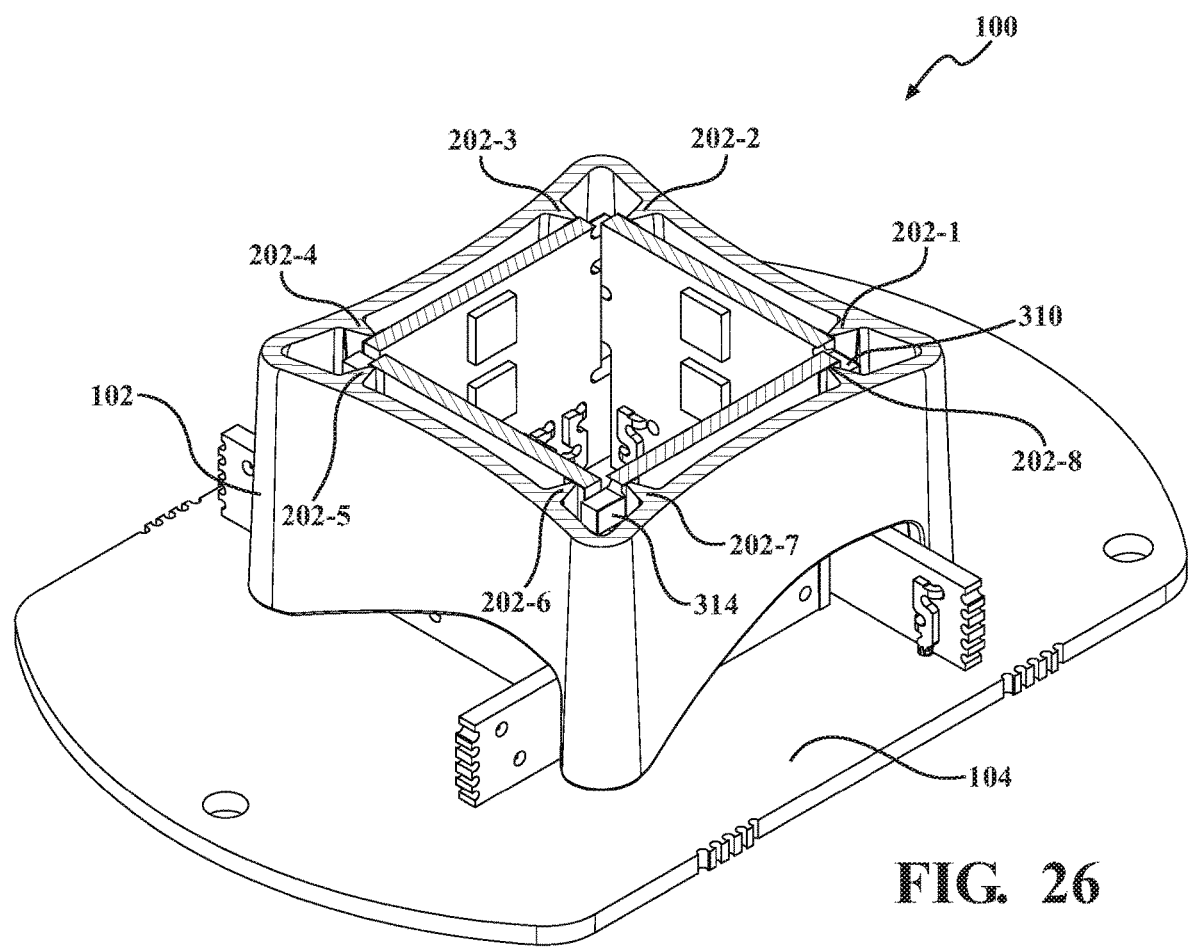
FIG. 26 depicts a cross sectional view the torque sensor module of FIG. 21 according to the teachings of the present disclosure.
Figure 27:
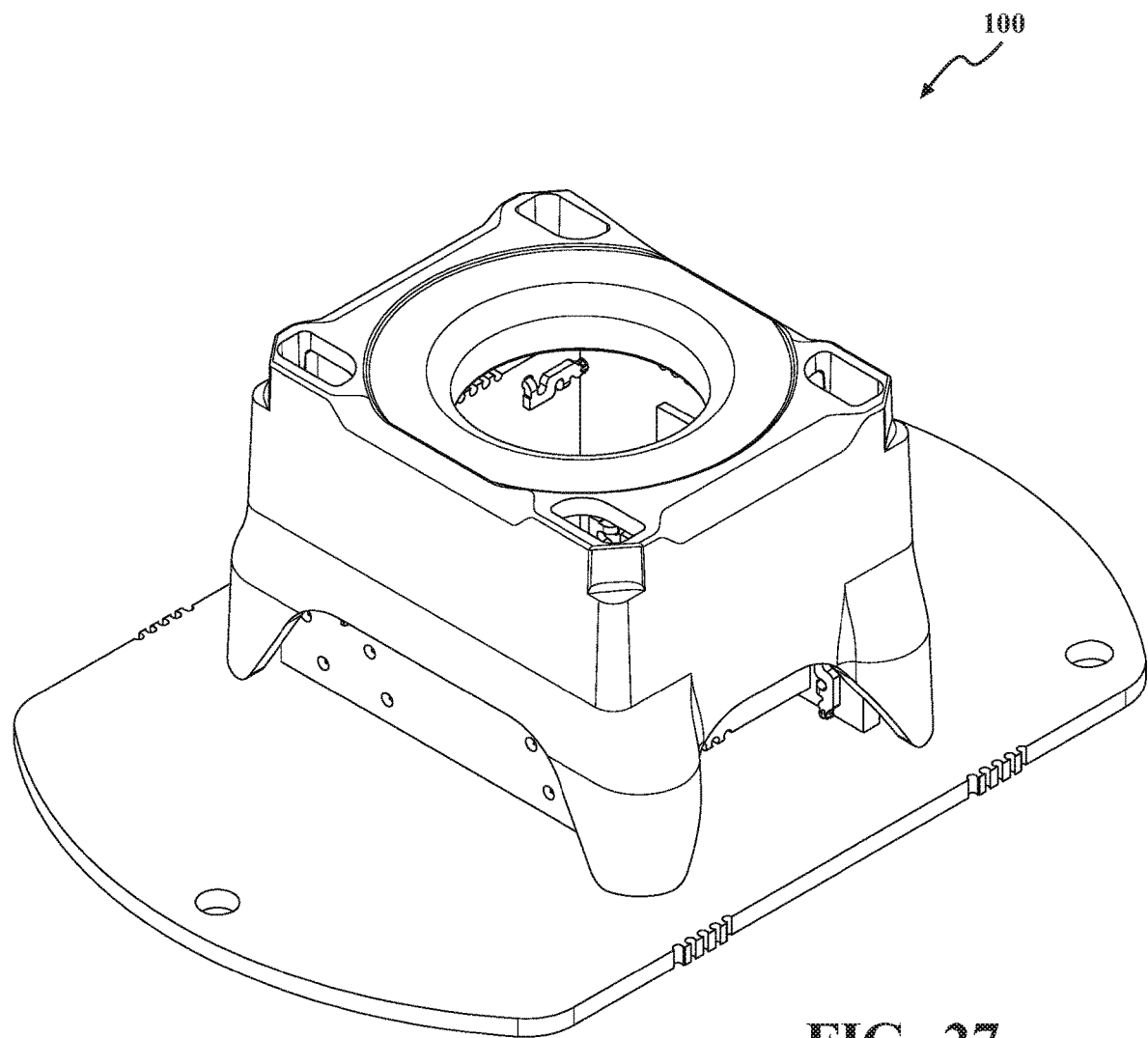
FIG. 27 depicts a perspective view of a fourth embodiment of a torque sensor module according to the teachings of the present disclosure.
Figure 28:
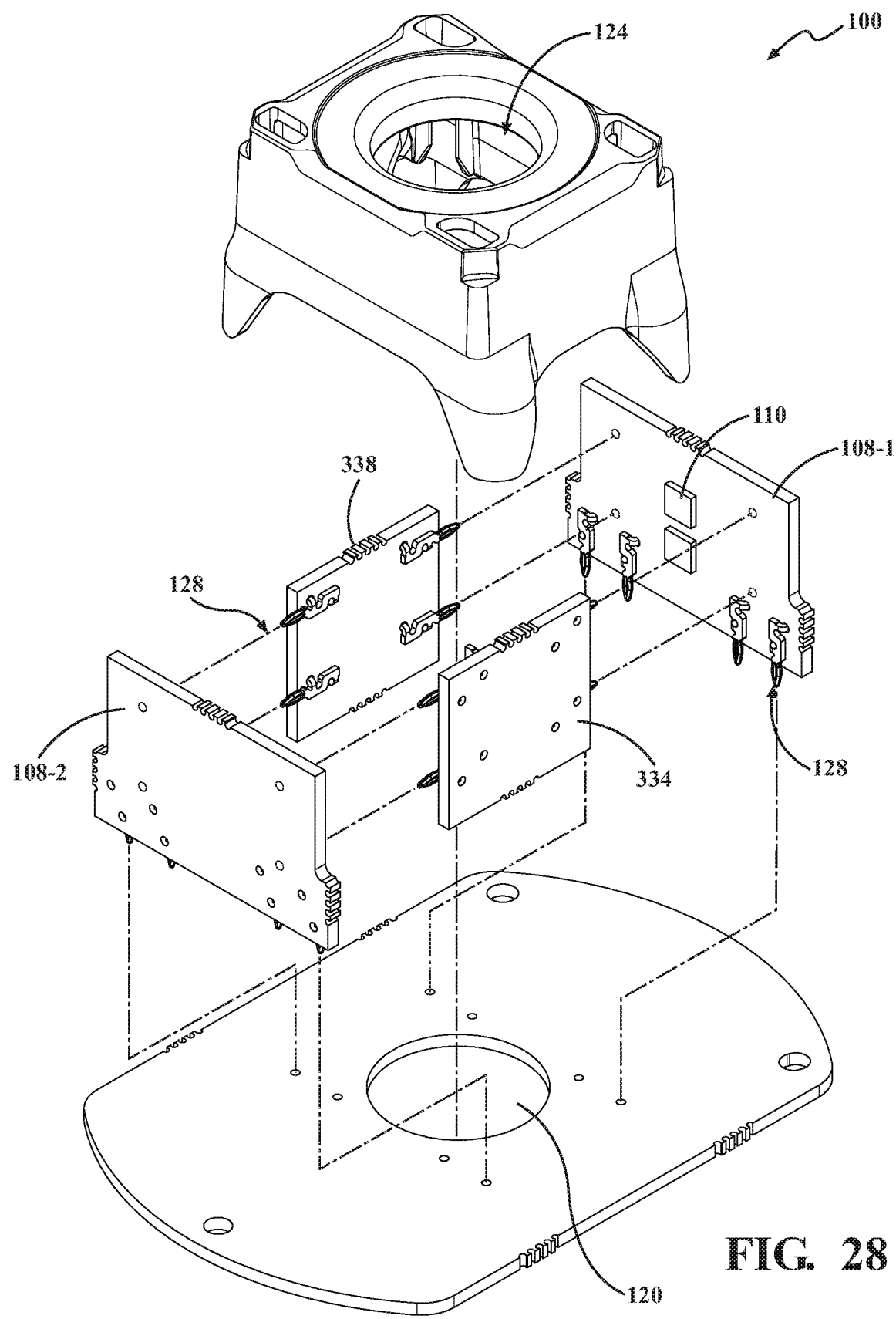
FIG. 28 depicts a first exploded view of the torque sensor module of FIG. 27 according to the teachings of the present disclosure.
Figure 29:
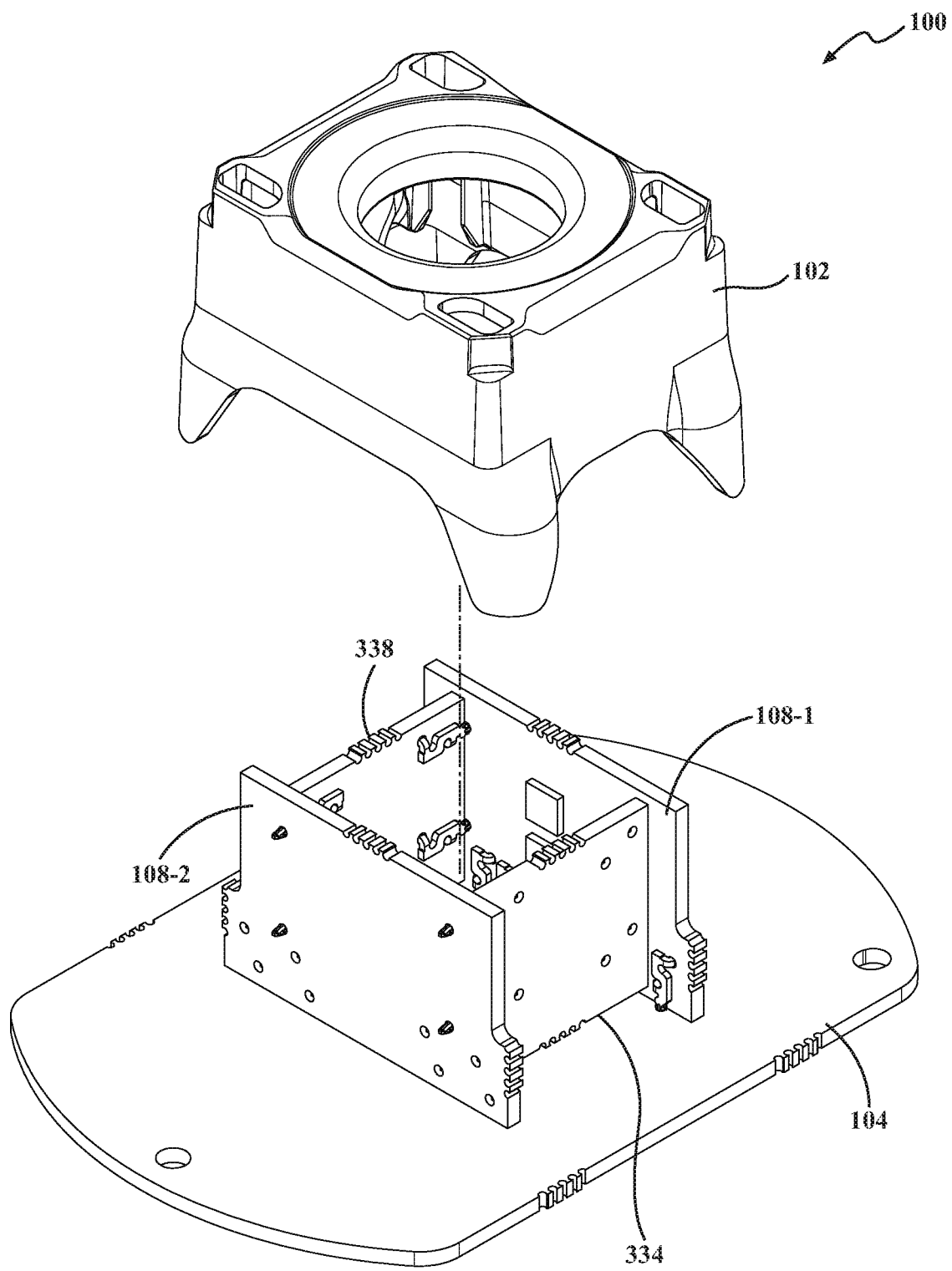
FIG. 29 depicts a second exploded view of the torque sensor module of FIG. 27 according to the teachings of the present disclosure.
Figure 30:
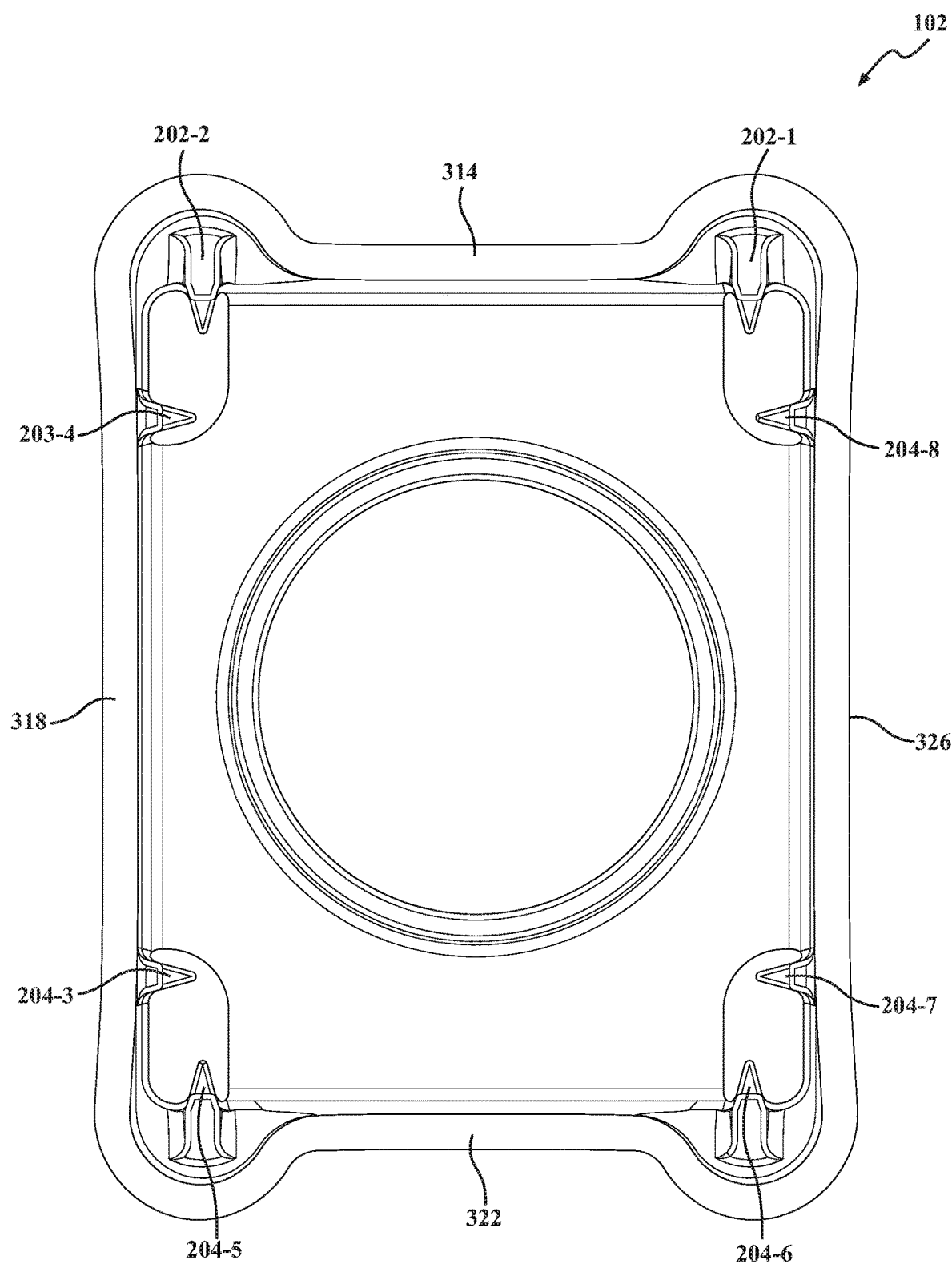
FIG. 30 depicts an underside view of a retainer of the torque sensor of FIG. 27 according to the teachings of the present disclosure.

With particular reference to FIG. 25, as previously discussed, the retention members 202 may be integrally formed with the inside surface of the retainer 102. Specifically, the first and second retention members 202-1, 202-2 may be integrally formed with an inside surface of a first side 316 of the retainer 102, the third and fourth retention members 202-3, 202-4 may be integrally formed with an inner surface of a second side 318 of the retainer 102, the fifth and sixth retention members 202-5, 202-6 may be integrally formed with an inner surface of a third side 322 of the retainer 102, and the seventh and eighth retention members 202-7, 202-8 may be integrally formed with an inside surface of the fourth side 326 of the retainer 102. With particular reference to FIG. 26, a cross sectional of the torque sensor module 100 is shown. At least one tab 310, 312, or 314 may seat with a pair of retention members. For example, as shown in the illustrated embodiment, the third tab 314 of the first auxiliary PCB 108-1 seats between the sixth retention member 202-6 and the seventh retention member 202-7.

With reference to FIGS. 27-31, a fourth embodiment of the torque sensor module 100 is shown. Like elements will be identified with the same reference numbers and the discussion will focus on the differences between the fourth embodiment and the first embodiment. In the illustrated embodiments, the auxiliary PCBs 108 include the first auxiliary PCB 108-1 and the second auxiliary PCB 108-2. A first side 334 and a second side 338 are coupled between the first auxiliary PCB 108-1 and the second auxiliary PCB 108-2 (i.e., the first pair of facing auxiliary PCBs 108) in order to assist in maintaining defined positions of the first and second auxiliary PCBs 108-1, 108-2 relative to each other. The first and second sides 334, 338 are coupled between the first and second auxiliary PCBs 108-1, 108-2 via the attachment elements 128. While it is contemplated that the attachment elements 128 couple the first side 334 and the second side 338 between the first 108-1 and second auxiliary PCB 108-2, any other suitable method may be used to couple the first side 334 and the second side 338 between the first auxiliary PCB 108-1 and second auxiliary PCB.

Figure 31:
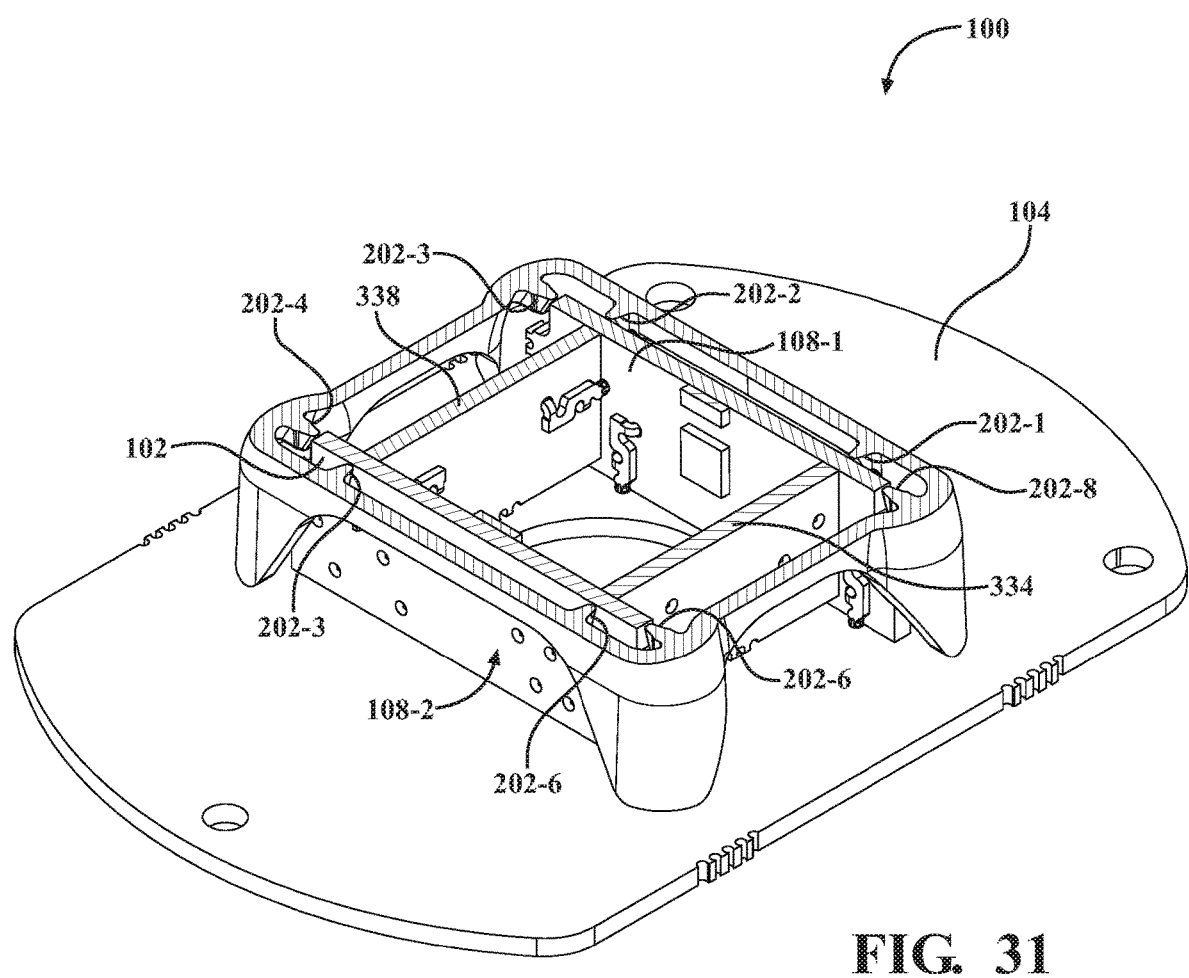
FIG. 31 depicts a cross sectional view of the torque sensor module of FIG. 27 according to the teachings of the present disclosure.

With particular reference to FIG. 31, a cross sectional of the torque sensor module 100 is shown. All of the retention members 202 engage directly with either the first auxiliary PCB 108-1 or the second auxiliary PCB 108-2. For example, the first and eighth retention members 202-1, 202-8 engage with one side of the first auxiliary PCB 108-1 and the second and third retention members 202-2, 202-3 engage with the other side of the first auxiliary PCB 108-1. The fourth and fifth retention members 202-4, 202-5 engage with one side of the second auxiliary PCB 108-2 and the sixth and seventh retention members 202-6, 202-7 may engage with the other side of the second auxiliary PCB 108-1.

Several embodiments have been discussed in the foregoing description. However, the embodiments discussed herein are not intended to be exhaustive or limit the invention to any particular form. The terminology which has been used is intended to be in the nature of words of description rather than of limitation. Many modifications and variations are possible in light of the above teachings and the invention may be practiced otherwise than as specifically described.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements.

As used herein, the phrase at least one of A, B, and C should be construed to mean a logical (A OR B OR C), using a non-exclusive logical OR, and should not be construed to mean "at least one of A, at least one of B, and at least one of C." The term subset does not necessarily require a proper subset. In other words, a first subset of a first set may be coextensive with (equal to) the first set.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks and flowchart elements described above serve as software specifications, which can be translated into the computer programs by the routine work of a skilled technician or programmer.

The computer programs include processor-executable instructions that are stored on at least one non-transitory computer-readable medium. The computer programs may also include or rely on stored data. The computer programs may include: (i) descriptive text to be parsed, such as HTML (hypertext markup language), XML (extensible markup language), or JSON (JavaScript Object Notation), (ii) assembly code, (iii) object code generated from source code by a compiler, (iv) source code for execution by an interpreter, (v) source code for compilation and execution by a just-in-time compiler, etc. As examples only, source code may be written using syntax from any suitable programming language.

What is claimed is:

1. A sensor assembly for a vehicle, said sensor assembly comprising:
   a sensor module having:
      a main printed circuit board (PCB);
      a plurality of auxiliary printed circuit boards (PCBs) coupled to said main PCB and electrically connected to said main PCB, each of said plurality of auxiliary PCBs having at least one sensor configured to generate a signal, and each of said plurality of auxiliary PCBs coupled to each other in a defined position relative to each other;
      a plurality of attachment elements to couple said plurality of auxiliary PCBs to said main PCB to at least partially maintain said defined position of each of said plurality of auxiliary PCBs relative to each other; and
   a retainer abutting said auxiliary PCBs,
   said retainer including a top member and an outer member,
   said top member being configured to be coupled to said plurality of auxiliary PCBs to define said coupling of each of said plurality of auxiliary PCBs to each other,
   said outer member, having a cylindrical shape, being configured to be disposed over said top member, said auxiliary PCBs and said main PCB;
   a component positioned adjacent said sensor module and moveable relative to said sensor module with said component having an emitter, wherein said signal generated by each of the at least one sensor of each of said plurality of auxiliary PCBs is based on movement of said component and said emitter; and
   a controller operatively connected to said at least one sensor of each of said plurality of auxiliary PCBs and configured to determine a magnitude of movement based on said signal from said at least one sensor of each of said plurality of auxiliary PCBs.

2. The sensor assembly of claim 1 wherein said plurality of attachment elements are configured to electrically connect a plurality of terminals of said plurality of auxiliary PCBs to a plurality of terminals of said main PCB.

3. The sensor assembly of claim 1 wherein said retainer includes a plurality of retention members that directly engage said plurality of auxiliary PCBs.

4. The sensor assembly of claim 3 wherein said plurality of retention members includes at least eight retention members.

5. The sensor assembly of claim 3 wherein:
   said plurality of auxiliary PCBs are mated together to form a plurality of corners;
   said plurality of retention members includes a plurality of pairs of retention members; and
   each pair of retention members of said plurality of pairs of retention members engages a corresponding corner of said plurality of corners.

6. The sensor assembly of claim 3 wherein said plurality of retention members are flexible.

7. The sensor assembly of claim 1 wherein at least one of said plurality of auxiliary PCBs include at least one tab for engaging an adjacent auxiliary PCB.

8. The sensor assembly of claim 1 wherein said retainer includes a plurality of posts selectively engaging said main PCB in order to provide a stop for said retainer.

9. The sensor assembly of claim 1 wherein:
said retainer defines a cavity;
at least a portion of each of said plurality of auxiliary PCBS-PCBs is disposed inside of said cavity; and
said retainer also includes a flange.

10. The sensor assembly of claim 1 wherein at least a portion of said auxiliary PCBs have grooves to interconnect to an adjacent auxiliary PCB of said plurality of auxiliary PCBs.

11. The sensor assembly of claim 1 wherein at least a portion of said auxiliary PCBs have notches to interconnect to an adjacent auxiliary PCB of said plurality of auxiliary PCBs.

12. The sensor assembly of claim 1 wherein:
said plurality of auxiliary PCBs includes a first auxiliary PCB and a second auxiliary PCB;
a bottom end of said first auxiliary PCB is coupled to said main PCB and a top end of said first auxiliary PCB is coupled to said top member of said retainer; and
a bottom end of said second auxiliary PCB is coupled to said main PCB and a top end of said second auxiliary PCB is coupled to said top member of said retainer.

13. The sensor assembly of claim 1 wherein an inner surface of said outer member has a plurality of ribs configured to engage with said top member and said main PCB.

14. The sensor assembly of claim 1 wherein:
said outer member of said retainer includes a first lip and a second lip;
an underside of said first lip includes a first plurality of extensions;
an underside of said second lip incudes a second plurality of extensions; and
said first plurality of extensions and said second plurality of extensions are configured to engage with said top member of said retainer.

15. The sensor assembly of claim 1 further comprising a plurality of sides coupled between said plurality of auxiliary PCBs to define said coupling of each of said plurality of auxiliary PCBs to each other.

16. The sensor assembly of claim 1 wherein said component is a shaft and said sensor module defines a channel to receive said shaft.

17. The sensor assembly of claim 16 wherein said retainer includes a center aperture defining a first end of said channel and said main PCB includes a center aperture defining a second end of said channel.

18. The sensor assembly of claim 17 wherein said center aperture of said retainer is axially aligned with said center aperture of said main PCB.

19. The sensor assembly of claim 1 wherein:
said emitter is further defined as at least one region being magnetoelastic and configured to generate a magnetic field in response to an applied torque;
said signal generated by said at least one sensor of each of said plurality of auxiliary PCBs is indicative of said magnetic field; and
said magnitude of movement is a magnitude of applied torque.

20. The sensor assembly of claim 1 wherein each of said plurality of auxiliary PCBs are directly coupled to each other.

21. The sensor assembly of claim 1 wherein said retainer at least partially maintains said defined position of each of said plurality of auxiliary PCBs relative to each other.

22. The sensor assembly of claim 1 wherein said plurality of attachment elements are integrally formed with said plurality of auxiliary PCBs.

* * * * *